(12) United States Patent
Sakuma

(10) Patent No.: US 6,870,754 B2
(45) Date of Patent: Mar. 22, 2005

(54) FERROELECTRIC MEMORY

(75) Inventor: Shinzo Sakuma, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/405,352

(22) Filed: Apr. 3, 2003

(65) Prior Publication Data

US 2004/0090810 A1 May 13, 2004

(30) Foreign Application Priority Data

Nov. 12, 2002 (JP) ........................................ 2002-328265

(51) Int. Cl.[7] ............................................. G11C 11/22
(52) U.S. Cl. ........................... 365/145; 365/63; 365/69; 365/149
(58) Field of Search ............................. 365/63, 69, 149

(56) References Cited

U.S. PATENT DOCUMENTS

| 6,363,003 B1 | * | 3/2002 | Miyamoto | .................. 365/145 |
| 6,504,749 B2 | * | 1/2003 | Jeon | ........................... 365/145 |
| 6,522,567 B2 | | 2/2003 | Iwanari | ...................... 365/145 |

FOREIGN PATENT DOCUMENTS

| JP | 08-315584 | 11/1996 | ........... G11C/14/00 |
| JP | 2001-351373 | 12/2001 | ........... G11C/11/22 |
| JP | 2002-015562 | 1/2002 | ........... G11C/11/22 |

OTHER PUBLICATIONS

Japanese Patent Kokai No. 2002–15562, "Low–power High–speed LSI Circuits & Technology" p. 231–247.

Masayuki Murakawa,"Low–power High–speed LSI Circuits & Technology", Jan. 31, 1998, pp. 231–249. (English translation included).

* cited by examiner

Primary Examiner—Son Mai
(74) Attorney, Agent, or Firm—Volentine Francos & Whitt, PLLC

(57) ABSTRACT

A memory cell array includes ferroelectric memory cells arranged in the form of m rows and n columns, bit lines provided along a row direction, and word lines and plate lines provided along a column direction. The word lines are provided side by side so as to intersect each other at the border between the fourth row and the fifth row. The arrangement allows the connecting of four ferroelectric memory cells to the same plate line and the same word line. Since the number of ferroelectric memory cells to be accessed simultaneously will be one-half of the number of memory cells provided in one row, unnecessary access to the ferroelectric memory cells can be reduced, thereby deterioration of the ferroelectric memory cells can be suppressed.

10 Claims, 16 Drawing Sheets

FERROELECTRIC MEMORY

BACKGROUND OF THE INVENTION

1) Field of the Invention

The present invention relates to a ferroelectric memory that uses polarization of a ferroelectric capacitor for storing data in the memory.

2) Description of the Related Art

A memory for storing data through the use of polarization of a ferroelectric capacitor is known in the prior art and is called a ferroelectric memory. Using a ferroelectric substance achieves a semiconductor memory having such characteristics as nonvolatility and random accessiblity.

A principle of the ferroelectric memory device is disclosed in articles such as "Low Power-consumption High-speed LSI Technology," Realize Incorporated, Jan. 31, 1998, pp.231–250. A circuitry of the ferroelectric memory is disclosed in Japanese Patent Laid-open Publication Kokai No.2002-15562.

As disclosed in the Japanese Patent Laid-open No.2002-15562, the ferroelectric memory device includes a memory cell array. The memory cell array includes one or a plurality of memory cell blocks. Each memory cell block includes a plurality of ferroelectric memory cells arranged in the form of a matrix, a plurality of bit lines, a plurality of word lines and a plurality of plate lines.

The ferroelectric memory cell includes one or two transistors and one or two ferroelectric capacitors. A ferroelectric memory cell including only one transistor and only one ferroelectric capacitor is called a 1T1C type memory cell. A ferroelectric memory cell including two transistors and two ferroelectric capacitors is called a 2T2C type memory cell.

Bit lines are provided along a row direction of the ferroelectric memory cells. A drain of each transistor within the ferroelectric memory cell is commonly connected to a corresponding bit line.

Word lines and plate lines are provided along a column direction of the ferroelectric memory cells. The word line is connected to a gate of a corresponding transistor. The plate line is connected to a source of a corresponding transistor via a ferroelectric capacitor.

When the data is read, a reading potential is applied to the selected word line and the selected plate line. As a result, the transistor is turned on, thereby the memory data is output to the bit line. A value of the memory data varies depending on a polarization direction of the ferroelectric capacitor.

Owing to the reading of the data from the ferroelectric memory, the memory data is destroyed. Memory data having the same value is therefore rewritten every time the data is read from the ferroelectric memory cell.

As described above, the word lines and the plate lines are both provided in a column direction. Therefore, the data are simultaneously read from all the ferroelectric memory cells which are connected to the same word line and the same plate line when reading the data. For example, if eight ferroelectric memory cells are connected to the same word line and the same plate line, it is impossible to read data from only four ferroelectric memory cells out of these eight ferroelectric memory cells. When the reading of only four memory cells is required, these eight data are read first, thereafter, only the four necessary data are output from the memory cell array.

As is widely known, characteristics of the ferroelectric capacitor deteriorate depending on the number of times for accessing the data. The ferroelectric capacitor no longer stores the data if such deterioration develops to a certain extent. Because of this, the ferroelectric memory has the disadvantage of a short life time.

In addition, the ferroelectric memory in the prior art is configured to simultaneously read unnecessary data as described above. Furthermore, rewriting after reading must be carried out for such unnecessary data. This rewriting substantially decreases the lifetime of the ferroelectric memory.

For example, in the aforementioned case, that is, in the case of the ferroelectric memory which requires accessing the eight ferroelectric memory cells for reading only four bits data, the number of times for accessing the cells to read the necessary data is equal to the number of times for accessing the cells to read the unnecessary data. Consequently, the lifetime of the ferroelectric memory is substantially decreased by half.

When the maximum number of accessible times of the ferroelectric capacitor is $10^{10}$, an average value of the maximum number of accessible times will be $5 \times 10^9$ for the ferroelectric memory which requires accessing the eight ferroelectric memory cells for reading the four bits data.

At the end of the life of the ferroelectric memory, a read data value is liable to be different from the written value, which impairs the reliability of the read data.

In order to decrease the number of unnecessary data accessing operations to the ferroelectric memory cell, it is effective to reduce the number of memory cells per unit memory cell block. Specifically, downsizing of the memory cell block reduces the number of memory cells which are connected to the same word line and the same plate line. Accordingly, the number of unnecessary data accesses can be decreased. However, downsizing of the memory cell block will increase the number of word lines and plate lines, thereby a circuit size which controls the word lines and plate lines is expanded.

SUMMARY OF THE INVENTION

For the aforementioned reasons, it is desired to provide a ferroelectric memory having a capability to reduce the number of times of unnecessary data access without expanding the peripheral circuit size or configuration, and having a higher reliability of the data.

A ferroelectric memory of the present invention comprises a memory cell block including ferroelectric memory cells arranged in the form of m rows×n columns where m and n are natural numbers, each of the ferroelectric memory cells outputting memory value from a data terminal thereof when reading potentials are applied to a first selective terminal and a second selective terminal; a plurality of bit lines each commonly connected to the data terminals of a plurality of the ferroelectric memory cells; a plurality of first selective lines each commonly connected to the first selective terminals of a plurality of the ferroelectric memory cells; a plurality of second selective lines each commonly connected to the second selective terminals of a plurality of the ferroelectric memory cells; wherein, the first selective lines and the second selective lines are provided so that the number of the ferroelectric memory cells connected to the same first selective line and the same second selective line is j where j is a factor of m.

This configuration allows the number of ferroelectric memory cells connected to the same first selective line and the same second selective line being j where j is a factor of m. Therefore, the invention allows providing the second selective line so as to access only data which are required to be accessed.

A ferroelectric memory of the present invention comprises a plurality of storing memory cell blocks including storing ferroelectric memory cells arranged in the form of m rows×n columns where m and n are natural numbers, each of the storing ferroelectric memory cells outputting memory value from a data terminal when reading potentials are applied to a first selective terminal and a second selective terminal; at least one determining memory cell block including determining ferroelectric memory cells arranged in the form of 1 row×n columns, each of the determining ferroelectric memory cells outputting memory value from a data terminal when reading potentials are applied to a first selective terminal and a second selective terminal; a plurality of bit lines each provided in row of the storing memory cell blocks so that each bit line commonly connected to the data terminals of the ferroelectric memory cells in corresponding row; determining bit lines each provided in row of the determining memory cell blocks so that each determining bit line commonly connected to the data terminals of the ferroelectric memory cells in corresponding row; a plurality of first selective lines each commonly provided in column of the storing memory cell blocks and the determining memory cell blocks so that each first selective line is commonly connected to the first selective terminals of the corresponding ferroelectric memory cells; second selective lines provided such that a plurality of the second selective lines correspond to a column of the storing memory cell blocks, and each second selective line is commonly connected to the second selective terminals of the corresponding ferroelectric memory; third selective lines provided such that each of the third selective lines corresponds to a column of the determining memory cell, and each of the line is commonly connected to the second selective terminals of the ferroelectric memory in corresponding column; a selective control circuit which applies a reading potential to a third selective line corresponding to any one of the second selective lines to which the reading potential is applied; and a determining circuit which determines a correctness of a memory value in the determining ferroelectric memory cell.

This configuration allows an access to the determining ferroelectric memory cell corresponding to the storing ferroelectric memory cell every time such storing ferroelectric memory cell is accessed. Therefore, when the number of storing memory cell block is two, the average number of times for accessing the determining ferroelectric memory cell is twice as much as the number of times for accessing the storing ferroelectric memory cell. Accordingly, life of the storing ferroelectric memory cell is determined by the determining circuit before the storing ferroelectric memory cell is completely deteriorated. Therefore, the invention allows determining whether the storing ferroelectric memory cell is reaching to the end of life or not.

DETAILED DESCRIPTION OF THE INVENTION

Figure 1:
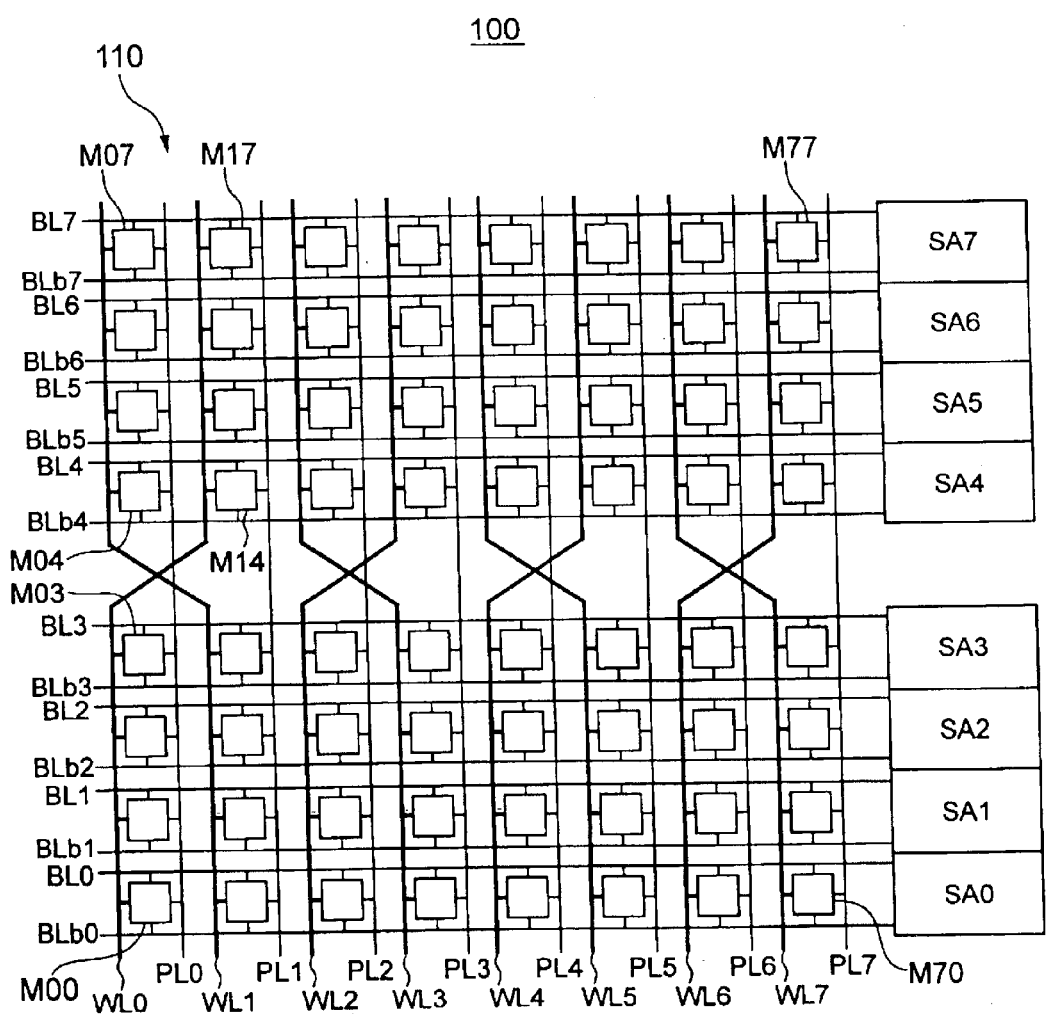
FIG. 1 is a block diagram schematically showing a configuration of a primary portion of a ferroelectric memory according to the first embodiment of the present invention.

Embodiments of the present invention will be hereinafter described with reference to the drawings. It should be noted that the size of each component, the configuration and arrangement shown in the drawings are schematically illustrated to the extent necessary for understanding of the present invention, and that numerical conditions or values are hereinafter cited only for an example.

First Embodiment

The first embodiment of the present invention will be hereinafter described with reference to FIGS. 1–3.

FIG. 1 is a block diagram schematically showing a configuration of a primary portion of a memory call array provided in a ferroelectric memory according to the embodiment. FIG. 2 is a circuit diagram showing an internal structure of the ferroelectric memory cell.

As shown in FIG. 1, the memory cell array 100 includes a memory cell block 110, bit lines BL0–BL7 and BLb0–BLb7, plate lines PL0–PL7, word lines WL0–WL7 and sense amplifiers SA0–SA7.

The memory cell block includes ferroelectric memory cells M00–M77 arranged in the form of 8 rows×8 columns. As shown in FIG. 2, each of the ferroelectric memory cells M00–M77 includes two transistors Tr0 and Tr1, and two ferroelectric capacitors FC0 and FC1. A gate and a drain of the transistor Tr0 are respectively connected to a word line WL and a bit line BL. In a similar manner, a gate and a drain of the transistor Tr1 are respectively connected to a word line WL and a bit line BLb. One terminal of the ferroelectric capacitor FC0 is connected to a plate line PL, and the other terminal thereof is connected to a source of the transistor Tr0. In a similar manner, one terminal of the ferroelectric capacitor FC1 is connected to a plate line PL, and the other terminal thereof is connected to a source of the transistor Tr1. In this structure, when the word line WL is applied with a reading potential (high level), the transistors Tr0 and Tr1 are turned on. Furthermore, when the plate line PL is applied with a reading potential (high level), an electric potential difference is created across the terminals of the ferroelectric capacitors FC0 and FC1. As a result, memory values stored in the ferroelectric capacitors FC0 and FC1 are output to the bit lines BL and BLb, respectively.

The bit lines BL0–BL7 and BLb0–BLb7 are respectively provided in rows of the ferroelectric memory cells M00–M77. Each of the bit lines BL0–BL7 is commonly connected to the drains of the transistors Tr0 provided along a corresponding row (reference is made to FIG. 2). Whereas, each of the bit lines BLb0–BLb7 is commonly connected to the drains of the transistors Tr1 provided along a corresponding row.

The plate lines PL0–PL7 are respectively provided in columns of the ferroelectric memory cells M00–M77. Each of the plate lines PL0–PL7 is commonly connected to the ferroelectric capacitors FC0 and FC1 provided along a corresponding column (reference is made to FIG. 2).

The word lines WL0–WL7 are provided along a column direction of the ferroelectric memory cells M00–M77. With respect to the word lines WL0, WL2, WL4 and WL6, an electrical potential is supplied from each word line to four ferroelectric memory cells in a lower section provided in a corresponding column, and to four ferroelectric memory cells in a upper section provided in a column after the corresponding column. With respect to the word lines WL1, WL3, WL5 and WL7, an electrical potential is supplied from each word line to four ferroelectric memory cells in a lower section provided in a corresponding column, and to four ferroelectric memory cells in a upper section provided in a column before the corresponding column. As a result, the four ferroelectric memory cells are connected to the same word line per each column. Each of the word lines WL0–WL7 is connected to the gates of the transistors Tr0 and Tr1 provided in a corresponding ferroelectric memory cell (reference is made to FIG. 2).

The sense amplifiers SA0–SA7 are respectively connected to pairs of bit lines BL0–BL7 and BLb0–BLb7. Each of the sense amplifiers SA0–SA7 amplifies an electrical potential or voltage of a corresponding pair of bit lines, thereafter, the amplified potential is output from the ferroelectric memory.

Figure 3:
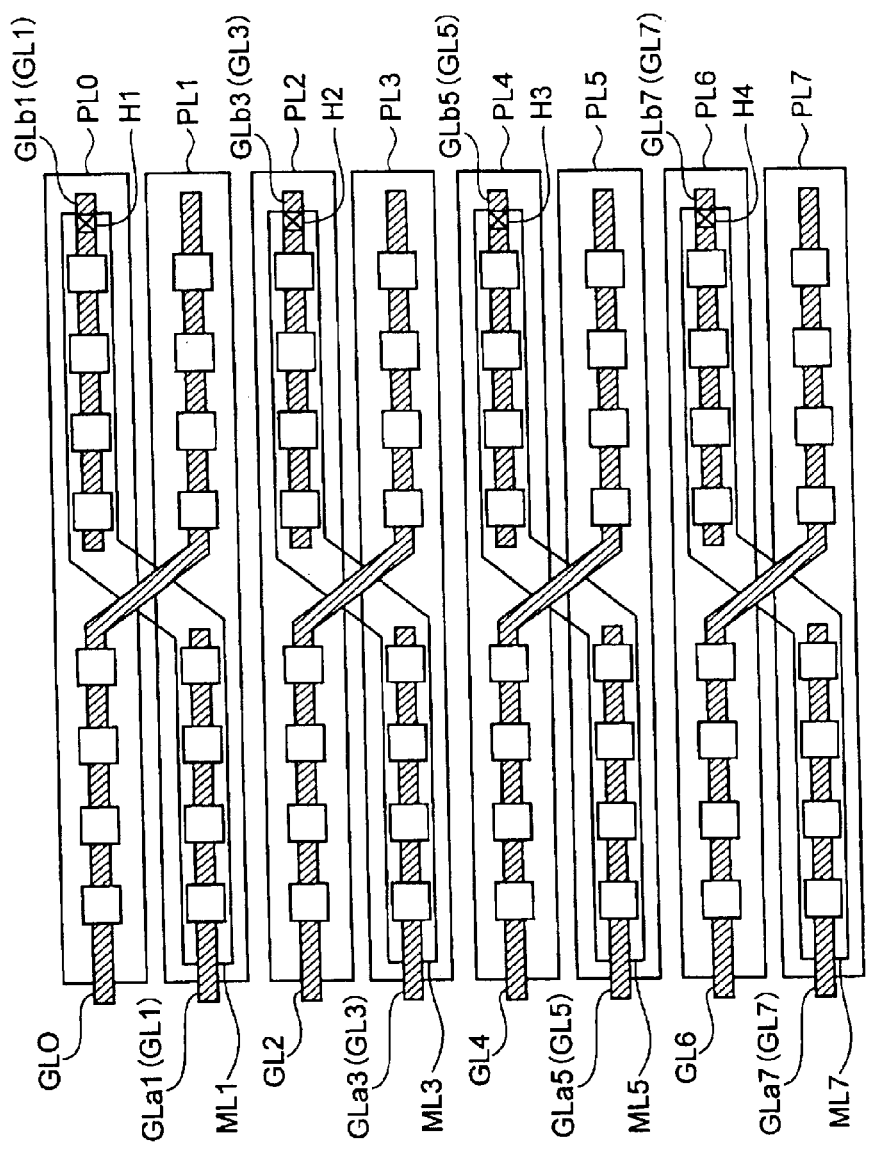
FIG. 3 is a top view conceptually showing a wiring layout of plate lines and word lines according to the first embodiment of the present invention.

FIG. 3 is a top view conceptually showing a wiring layout of the plate lines PL0–PL7 and the word lines WL0–WL7.

Each of the plate lines PL0–PL7 is linearly formed by metal so that each plate line is provided in each column. The plate lines PL0–PL7 are of the same size, and the plate lines are arranged at regular intervals.

The word lines WL0–WL7 include gate wiring patterns GL0–GL7, and metal wiring patterns ML1, ML3, ML5 and ML7. The gate wiring patterns GL0–GL7 are formed in a gate wiring layer using the same materials as that used for the gate of the transistors Tr0 and Tr1, such as polysilicon (reference is made to FIG. 2). The metal wiring patterns ML0–ML7 are formed in a metal wiring layer using materials such as aluminum. It should be noted that the gate wiring patterns GL0, GL2, GL4 and GL6 are formed in a stair-like shape, so as to commonly connect to the ferroelectric memory cells provided in two consecutive columns in such a manner that four bits are connected per each column. The gate wiring patterns GL1, GL3, GL5 and GL7 include partial gate wiring patterns GLa1, GLa3, GLa5 and GLa7, and GLb1, GLb3, GLb5 and GLb7. Each partial gate wiring pattern is commonly connected to the four ferroelectric memory cells consecutively provided in each column. The metal wiring patterns ML1, ML3, ML5 and ML7 are formed in a reversed stair-like shape, so as to correspond to the ferroelectric memory cells provided in two consecutive columns in such a manner that four bits are corresponded to per each column. The metal wiring patterns ML1, ML3, ML5 and ML7 are respectively connected to the partial gate wiring patterns GLb1, GLb3, GLb5 and GLb7 via through-holes H1, H2, H3 and H4.

As described above, the ferroelectric memory according to the embodiment permits the plate lines PL0–PL7 and the word lines WL0–WL7 to be made in the form of a consecutive repeated pattern.

An operation of the ferroelectric memory shown in FIGS. 1–3 will be hereinafter described. The following description is made based on an assumption that the memory data stored in the ferroelectric memory cells M00–M03 are simultaneously read.

Firstly, the electrical potential of the word line WL0 is set to a predetermined reading potential or voltage (e.g., high level). As a result, a predetermined electrical potential is applied to the gates of the transistors Tr0 and Tr1 each provided in the ferroelectric memory cells M00–M03 and M14–M17 (reference is made to FIG. 2).

Then, the electrical potential of the plate line PL0 is set to a predetermined reading potential or voltage (e.g., high level). As a result, a predetermined electrical potential is applied to the terminals of the ferroelectric capacitors FC0 and FC1 each provided in the ferroelectric memory cells M00–M07.

Supplying the reading potentials to the word line WL0 and the plate line PL0 allows an output of minute electrical potentials or voltages from the ferroelectric memory cells M00–M03 to the bit lines BL0–BL3 and BLb0–BLb3. As described above, each of the ferroelectric memory cells includes a pair of the ferroelectric capacitors FC0 and FC1 (reference is made to FIG. 2). In each ferroelectric memory cell, a "1" or "0" is recorded in the ferroelectric capacitor FC0, whereas, the other of a "1" or "0" is recorded in ferroelectric capacitor FC1. Values of the minute electrical potentials which are output to the bit lines BL0–BL3 and BLb0–BLb3 differ with respect to each other depending on memory values stored in the corresponding ferroelectric capacitors. The sense amplifiers SA0–SA3 amplify the minute electrical potentials supplied from the corresponding bit lines, thereafter, the amplified potentials are output to the outside.

The ferroelectric memory cells M04–M07 are connected to the plate line PL0, however, the memory cells are not connected to the word line WL0. Accordingly, a high-level electrical potential is applied to the terminals of the ferroelectric capacitors FC0 and FC1, whereas, a low-level electrical potential is applied to the gates of the transistors Tr0 and Tr1. The data are therefore not read from the ferroelectric capacitors FC0 and FC1. Consequently, no deterioration of the ferroelectric capacitors FC0 and FC1 develops in the ferroelectric memory cells M04–M07.

The ferroelectric memory cells M14–M17 are connected to the word line WL0, however, the memory cells are not connected to the plate line PL0. Accordingly, a high level electrical potential is applied to the gates of the transistors Tr0 and Tr1, whereas, a low level electrical potential is applied to the terminals of the ferroelectric capacitors FC0 and FC1. The data are therefore not read from the ferroelectric capacitors FC0 and FC1. Consequently, no deterioration of the ferroelectric capacitors FC0 and FC1 develops in the ferroelectric memory cells M14–M17.

As described above, the amount of data which is simultaneously read is four bits in this embodiment, even though eight ferroelectric memory cells are provided in the same column. Therefore, when the four bits of data are read at a time, the number of accessing times to the ferroelectric memory cells M00–M07 will be decreased by half on average as compared with the ferroelectric memory in the prior art. Furthermore, when a request is made to read data that is less than or equal to three bits, the number of accessing times to the ferroelectric memory cells will be also decreased by half on average as compared with the ferroelectric memory in the prior art.

Consequently, the ferroelectric memory according to the embodiment is expected to have a life time twice as long as that in the prior art.

In addition, the ferroelectric memory according to the embodiment decreases unnecessary access to the ferroelectric memory cells, thereby power consumption can be reduced.

Furthermore, adopting the layout shown in FIG. 3 allows downsizing of a semiconductor integrated circuit and ease of designing.

Second Embodiment

Another embodiment of the present invention will be hereinafter described with reference to FIGS. 4–6.

Figure 4:
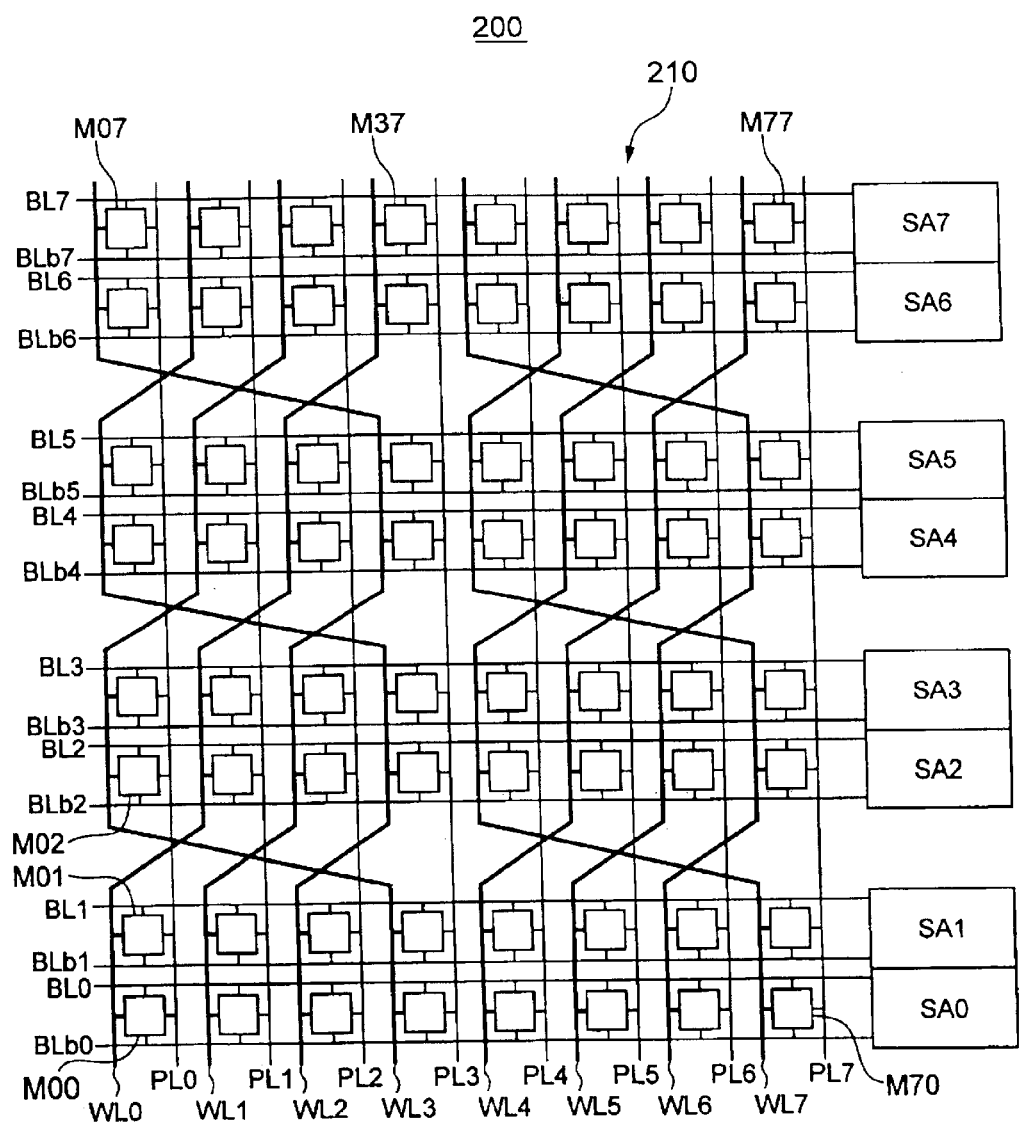
FIG. 4 is a block diagram schematically showing a configuration of a primary portion of a ferroelectric memory according to the second embodiment of the present invention.

FIG. 4 is a block diagram schematically showing a configuration of a primary portion of a memory cell array provided in a ferroelectric memory according to the embodiment.

As shown in FIG. 4, the memory cell array 200 of the ferroelectric memory according to the embodiment differs from the ferroelectric memory according to the first embodiment with respect to a layout of the word lines WL0–WL7.

The word lines WL0–WL7 are provided in a column direction of the ferroelectric memory cells M00–M77. The word lines WL0–WL3 respectively correspond to first through fourth columns, and each word line applies an electrical potential to two ferroelectric memory cells per each column. The word lines WL4–WL7 respectively correspond to fifth through eighth columns, and each word line applies an electrical potential to two ferroelectric memory cells per each column. The word lines WL0–WL7 are connected to the gates of the transistors Tr0 and Tr1 provided in the corresponding ferroelectric memory cells (reference is made to FIG. 2).

Figure 5:
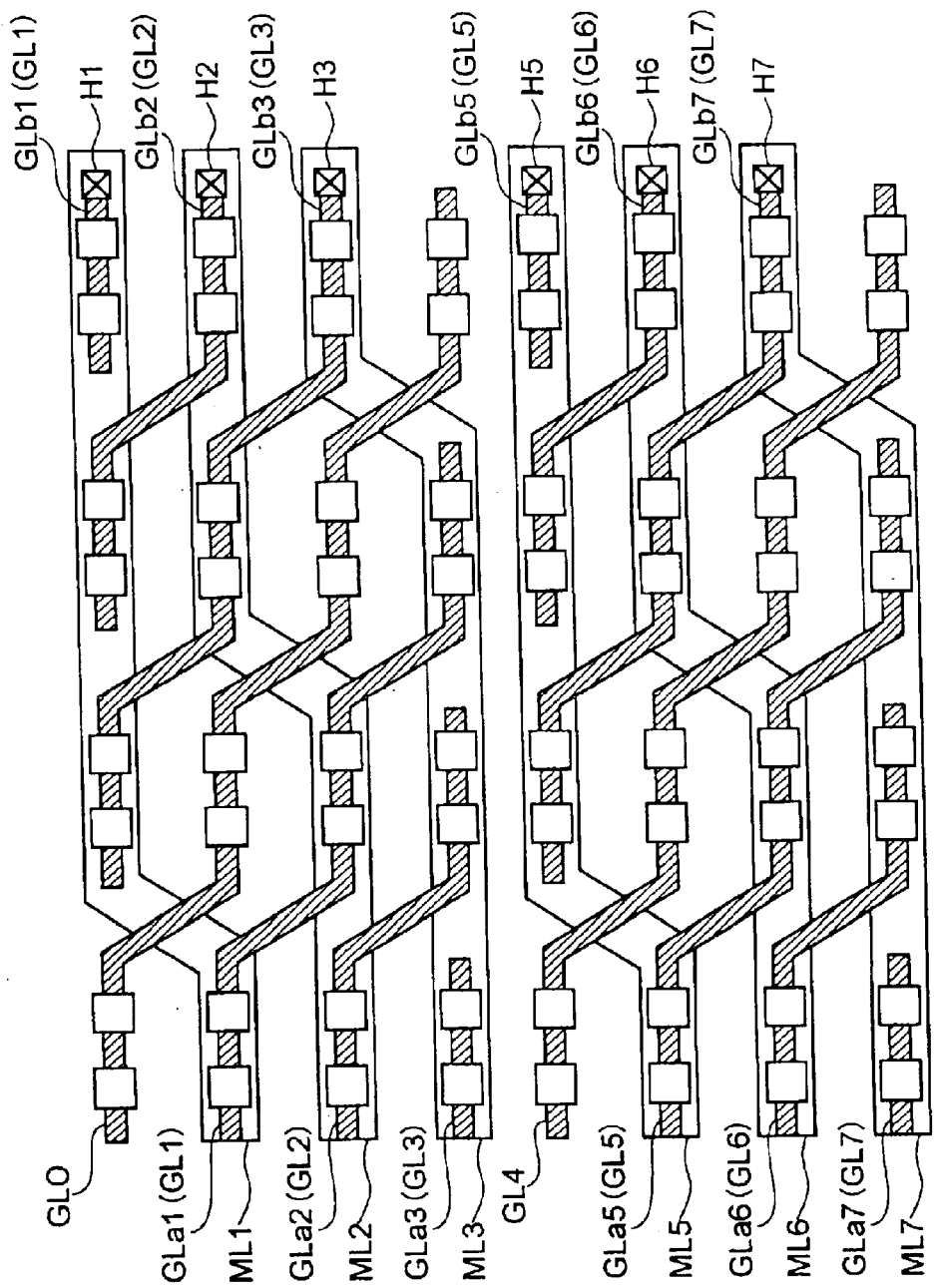
FIG. 5 is a top view conceptually showing a wiring layout of plate lines and word lines according to the second embodiment of the present invention.

FIG. 5 is a top view conceptually showing one example of a wiring layout of word lines WL0–WL7. It should be noted that a layout of the plate lines PL0–PL7 is the same as that of the first embodiment (reference is made to FIG. 3).

The word lines WL0–WL7 include gate wiring patterns GL0–GL7, and metal wiring patterns ML1–ML3 and ML5–ML7.

Figure 2:
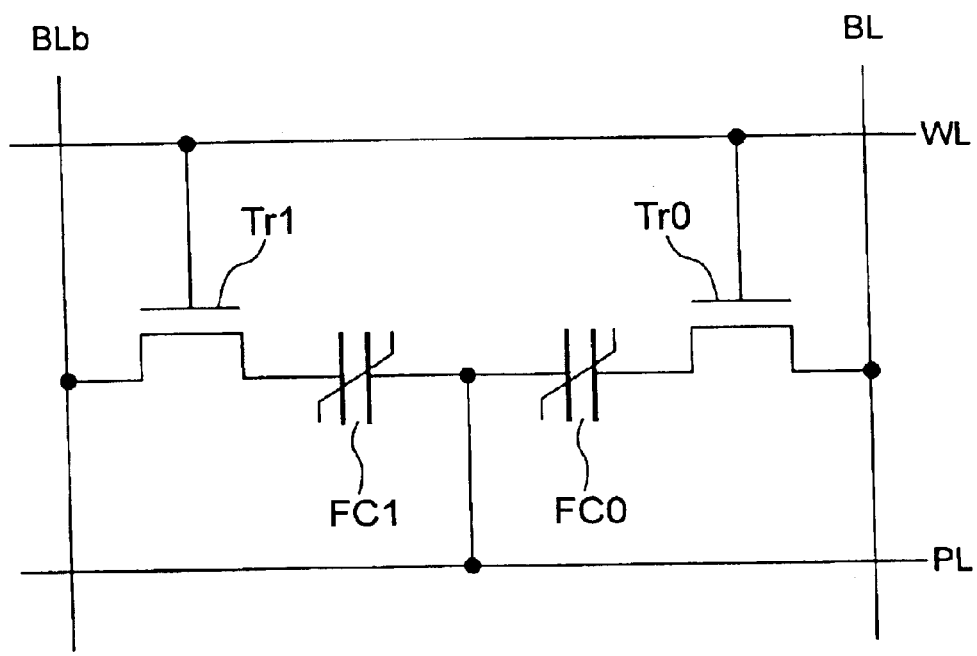
FIG. 2 is a circuit diagram showing an internal structure of the ferroelectric memory cell.

The gate wiring patterns GL0–GL7 are formed as a gate wiring layer using the same materials as that used for the gate of the transistors Tr0 and Tr1, such as polysilicon (reference is made to FIG. 2). Each of the gate wiring patterns GL1–GL3 includes two partial gate wiring patterns GLa1–GLa3 and GLb1–GLb3. In a similar manner, each of the gate wiring patterns GL5–GL7 includes two partial gate wiring patterns GLa5–GLa7 and GLb5–GLb7. As shown in FIG. 5, each gate wiring pattern is formed in a stair-like shape, so as to commonly connect to the ferroelectric memory cells provided in corresponding columns in such a manner that two bits are connected per each column.

The metal wiring patterns ML1–ML3 and ML5–ML7 are formed as a metal wiring layer using materials such as aluminum. The metal wiring patterns ML1–ML3 and ML5–ML7 are formed in a reverse-stair-like shape, so as to correspond to the two consecutive columns. The metal wiring patterns ML1–ML3 and ML5–ML7 are respectively connected to the gate wiring patterns GL0–GL3 and GL5–GL7 via through-holes H1–H3 and H5–H7.

As described above, the ferroelectric memory according to the embodiment permits the word lines WL0–WL7 to be made in the form of a consecutive repeated pattern.

Figure 6:
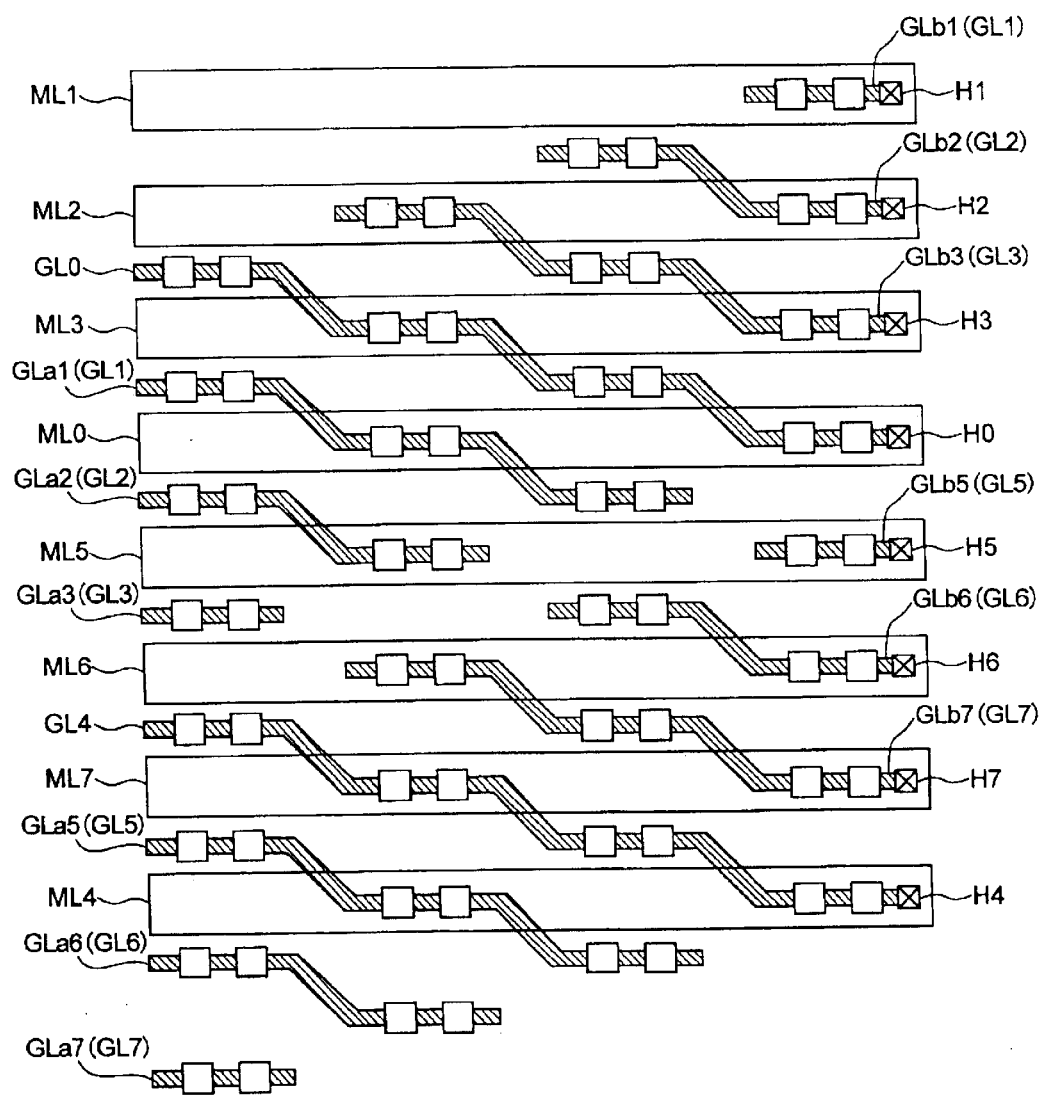
FIG. 6 is a top view conceptually showing a wiring layout of plate lines and word lines according to the second embodiment.

FIG. 6 is a top view conceptually showing another example of a wiring layout of word lines WL0–WL7. It should be noted that a layout of the plate lines PL0–PL7 is the same as that of the first embodiment (reference is made to FIG. 3).

The word lines WL0–WL7 include gate wiring patterns GL0–GL7, and metal wiring patterns ML0–ML7.

In the example shown in FIG. 6, connection points between the gate wiring patterns GL0–GL7 and the ferroelectric memory cells, i.e. the gates of the transistors Tr0 and Tr0, are arranged stepwise so that one-half of a cycle is shifted per two ferroelectric memory cells.

The gate wiring patterns GL0–GL7 are formed in a gate wiring layer using the same materials as that used for the gate of the transistors Tr0 and Tr1, such as polysilicon (reference is made to FIG. 2). Each of the gate wiring patterns GL1–GL3 includes two partial gate wiring patterns GLa1–GLa3 and GLb1–GLb3. In a similar manner, each of the gate wiring patterns GL5–GL7 includes two partial gate wiring patterns GLa5–GLa7 and GLb5–GLb7. As shown in FIG. 6, each gate wiring pattern is formed in a stair-like shape, so as to commonly connect to the ferroelectric memory cells provided in corresponding columns in such a manner that two bits are connected per each column.

The metal wiring patterns ML0–ML7 are formed in a metal wiring layer using materials such as aluminum. The metal wiring patterns ML0–ML7 are formed in a linear shape so as to correspond to each column. The metal wiring patterns ML0–ML7 are respectively connected to the gate wiring patterns GL0–GL7 via through-holes H0–H7. The through-holes H0 and H4 are not necessary required.

An operation of the ferroelectric memory according to the embodiment will be hereinafter described. The following description is made based on an assumption that the memory data stored in the ferroelectric memory cells M00 and M01 are simultaneously read.

Firstly, the electrical potential of the word line WL0 is set to a predetermined reading potential or voltage (high level). As a result, a predetermined electrical potential is applied to the gates of the transistors Tr0 and Tr1 each provided in the ferroelectric memory cells M00 and M01 (reference is made to FIG. 2).

Then, the electrical potential of the plate line PL0 is set to a predetermined reading potential or voltage (high level). As a result, a predetermined electrical potential is applied to the terminals of the ferroelectric capacitors FC0 and FC1 each provided in the ferroelectric memory cells M00 and M01.

Supplying the reading potentials to the word line WL0 and the plate line PL0 allows an output of minute electrical potentials from the ferroelectric memory cells M00 and M01 to the bit lines BL0, BL1, BLb0 and BLb1. The sense amplifiers SA0 and SA1 amplify the minute electrical potentials supplied from the corresponding bit lines, thereafter, the amplified potentials are output to the outside.

The ferroelectric memory cells M02–M07 are connected to the plate line PL0, however, the memory cells are not connected to the word line WL0. The data are therefore not read from the ferroelectric capacitors FC0 and FC1 in the ferroelectric memory cells M02–M07. Consequently, no deterioration of the capacitors FC0 and FC1 develops.

The ferroelectric memory cells M12, M13, M24, M25, M36 and M37 are connected to the word line WL0, however, the memory cells are not connected to the plate line PL0. The data are therefore not read from the ferroelectric capacitors FC0 and FC1 in the ferroelectric memory cells. Consequently, no deterioration of the capacitors FC0 and FC1 develops.

As described above, the amount of data which is simultaneously read is two bits in the embodiment, even though eight ferroelectric memory cells are provided in the single column. Therefore, when the two bits of data are read at a time, the number of times for accessing the ferroelectric memory cells M00–M07 will be decreased to a quarter on average as compared with the ferroelectric memory in the prior art. Furthermore, when a request is made to read data that is equal to one bit, the number of times for accessing the ferroelectric memory cells will be also decreased to a quarter on average as compared with the ferroelectric memory in the prior art.

Consequently, the ferroelectric memory according to the embodiment is expected to have a life time four times as long as that in the prior art.

In addition, the ferroelectric memory according to the embodiment decreases unnecessary access to the ferroelectric memory cells, thereby power consumption can be reduced.

Furthermore, using the layout shown in FIGS. 5 and 6 allows downsizing of a semiconductor integrated circuit and simplification of the design.

Third Embodiment

A third embodiment of the present invention will be hereinafter described with reference to FIGS. 7 and 8.

Figure 7:
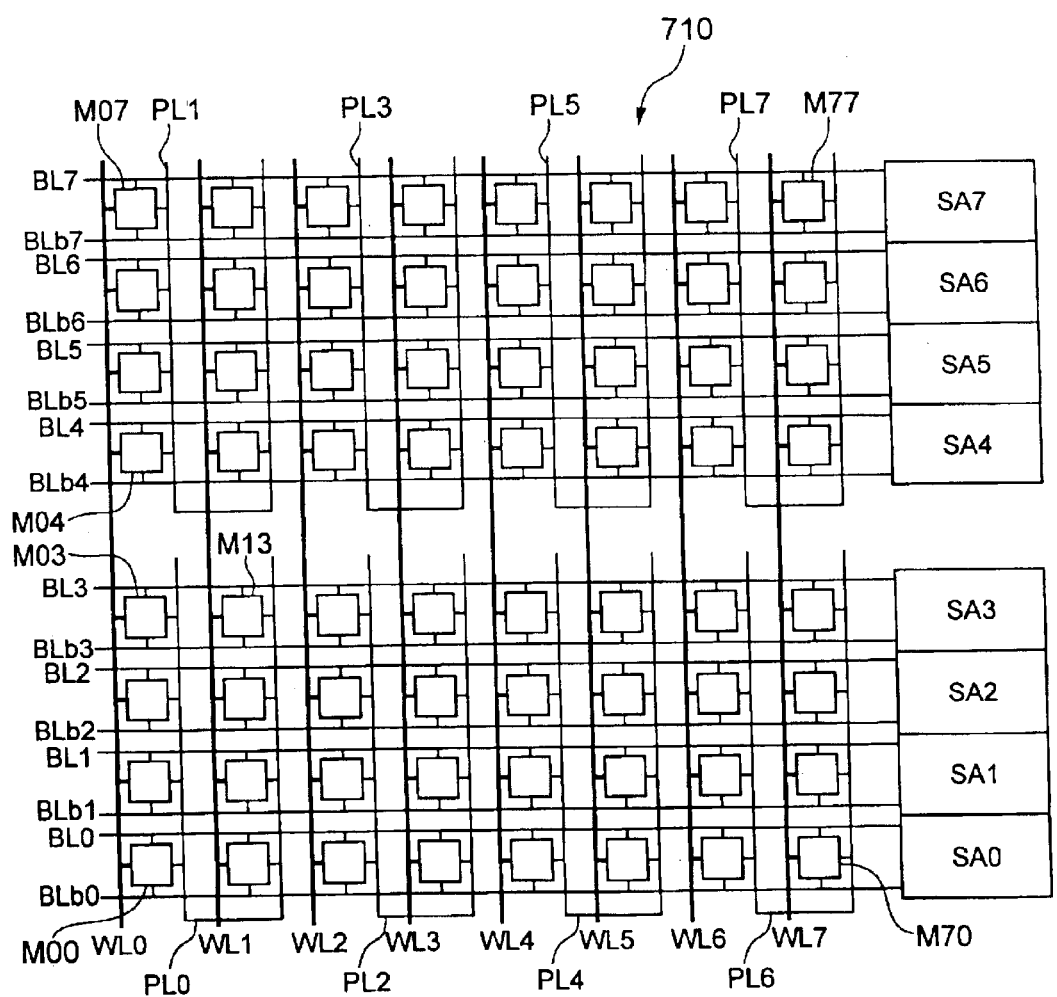
FIG. 7 is a block diagram schematically showing a configuration of a primary portion of a ferroelectric memory according to the third embodiment of the present invention.

FIG. 7 is a block diagram schematically showing a configuration of a primary portion of a memory cell array provided in a ferroelectric memory according to the embodiment.

As shown in FIG. 7, the memory cell array 700 differs from the aforementioned first embodiment with respect to the layouts of the plate lines PL0–PL7 and the word lines WL0–WL7.

The word lines WL0–WL7 are provided in a column direction of the ferroelectric memory cells M00–M77. The word lines WL0–WL7 are commonly connected to the gates of the transistors Tr0 and Tr1 provided in corresponding columns (reference is made to FIG. 2).

Each of the plate lines PL0–PL7 is provided in two columns of the ferroelectric memory cells M00–M77, so that each plate line applies an electrical potential to four bits of the ferroelectric memory cells in each corresponding column. Each of the plate lines PL0–PL7 is connected to each terminal of the ferroelectric capacitors FC0 and FC1 provided in the corresponding ferroelectric memory cells (reference is made to FIG. 2).

Figure 8:
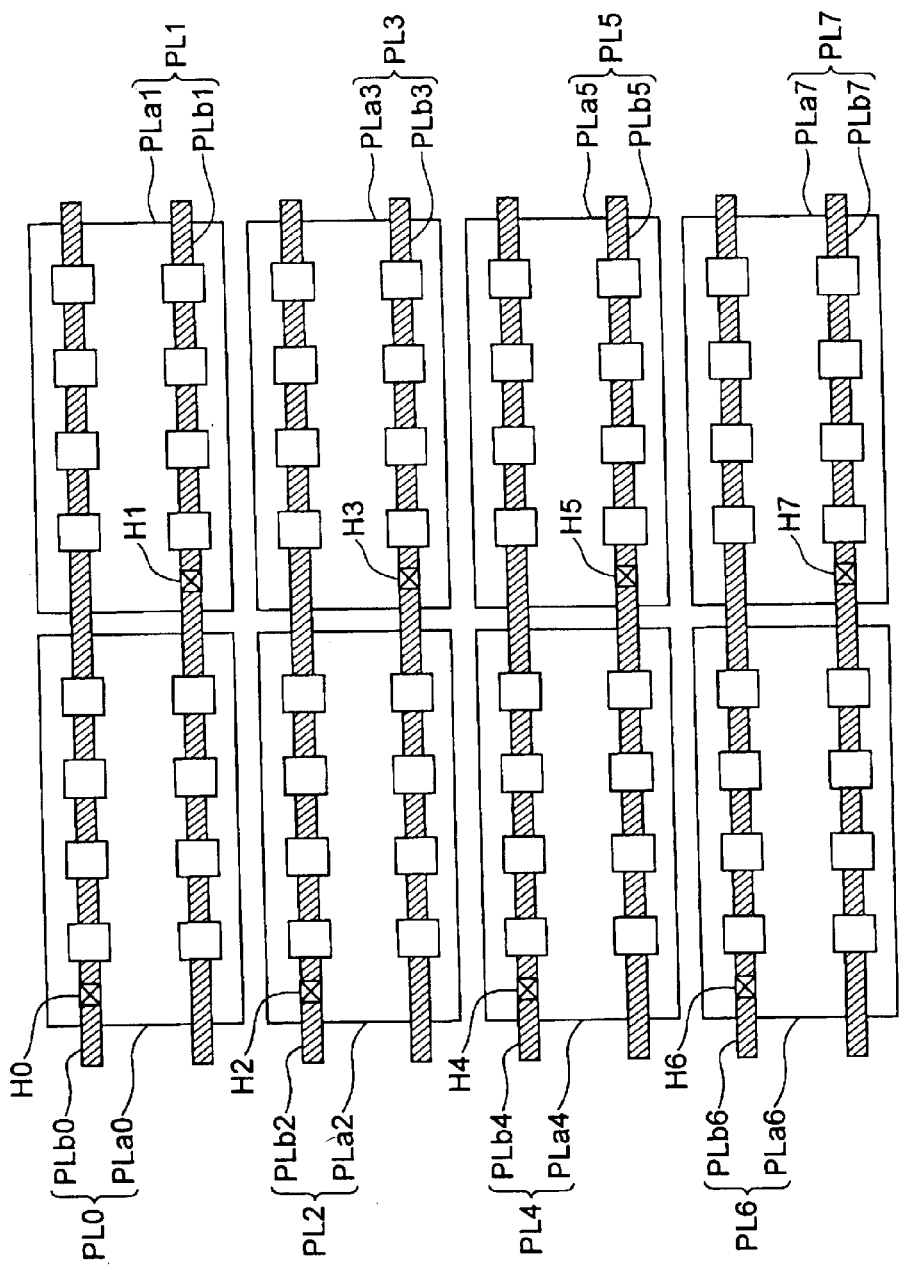
FIG. 8 is a top view conceptually showing a wiring layout of plate lines and word lines according to the third embodiment.

FIG. 8 is a top view conceptually showing a wiring layout of the plate lines PL0–PL7. The word lines WL0–WL7 are each formed in a gate wiring layer using the same materials as that used for the gate of the transistors Tr0 and Tr1, such as polysilicon (reference is made to FIG. 2).

The plate lines PL0–PL7 include first wiring patterns PLa0–PLa7 formed in a first wiring layer in a rectangular shape and second wiring patterns PLb0–PLb7 formed in a second wiring layer in a linear shape. As shown in FIG. 8, each first wiring pattern is provided for each matrix having 2 rows×4 columns of the ferroelectric memory cells, so as to connected to the ferroelectric capacitors FC0 and FC1 provided in the corresponding ferroelectric memory cells (reference is made to FIG. 2). Each of the second wiring patterns PLb0–PLb7 is provided in each column of the ferroelectric memory cells so as to connected to the corresponding first wiring patterns PLa0–PLa7 via through-holes H1–H7.

As described above, the ferroelectric memory according to the embodiment permits the plate lines PL0–PL7 to be made in the form of a consecutive repeated pattern.

An operation of the ferroelectric memory shown in FIGS. 7 and 8 will be hereinafter described. The following description is made based on an assumption that the memory data stored in the ferroelectric memory cells M00–M03 are simultaneously read.

Firstly, the electrical potential of the word line WL0 is set to a predetermined reading potential (high level). As a result, a predetermined electrical potential is applied to the gates of the transistors Tr0 and Tr1 each provided in the ferroelectric memory cells M00–M07 (reference is made to FIG. 2).

Then, the electrical potential of the plate line PL0 is set to a predetermined reading potential (high level). As a result, a predetermined electrical potential is applied to the terminals of the ferroelectric capacitors FC0 and FC1 each provided in the ferroelectric memory cells M00–M03 and M10–M13.

Supplying the reading potential to the word line WL0 and the plate line PL0 allows an output of minute electrical potentials from the ferroelectric memory cells M00–M03 to the bit lines BL0–BL3 and BLb0–BLb3. The sense amplifiers SA0–SA3 amplify the minute electrical potentials supplied from the corresponding bit lines, thereafter, the amplified potentials are output to the outside.

The ferroelectric memory cells M04–M07 are connected to the word line WL0, however, the memory cells are not connected to the plate line PL0. The data are therefore not read from the ferroelectric capacitors FC0 and FC1 in the ferroelectric memory cells M04–M07. Consequently, no deterioration of the capacitors FC0 and FC1 develops.

The ferroelectric memory cells M10–M13 are connected to the plate line PL0, however, the memory cells are not connected to the word line WL0. The data are therefore not read from the ferroelectric capacitors FC0 and FC1 in the ferroelectric memory cells. Consequently, no deterioration of the capacitors FC0 and FC1 develops.

As described above, the amount of data which is simultaneously read is four bits in the embodiment, even though eight ferroelectric memory cells are provided in the single column. Therefore, when the four bits of data are read at a time, the number of times for accessing the ferroelectric memory cells M00–M07 will be decreased by half on average as compared with the ferroelectric memory in the prior art. Furthermore, when a request is made to read data that is less than or equal to three bits, the number of times for accessing the ferroelectric memory cells will be also decreased by half on average as compared with the ferroelectric memory in the prior art.

Consequently, the ferroelectric memory according to the embodiment is expected to have a life time twice as long as that in the prior art.

In addition, the ferroelectric memory according to the embodiment decreases unnecessary access to the ferroelectric memory cells, thereby power consumption can be reduced.

Furthermore, using the layout shown in FIG. 8 allows downsizing of a semiconductor integrated circuit and simplification of the design.

Fourth Embodiment

A fourth embodiment of the present invention will be hereinafter described with reference to FIGS. 9 and 10.

Figure 9:
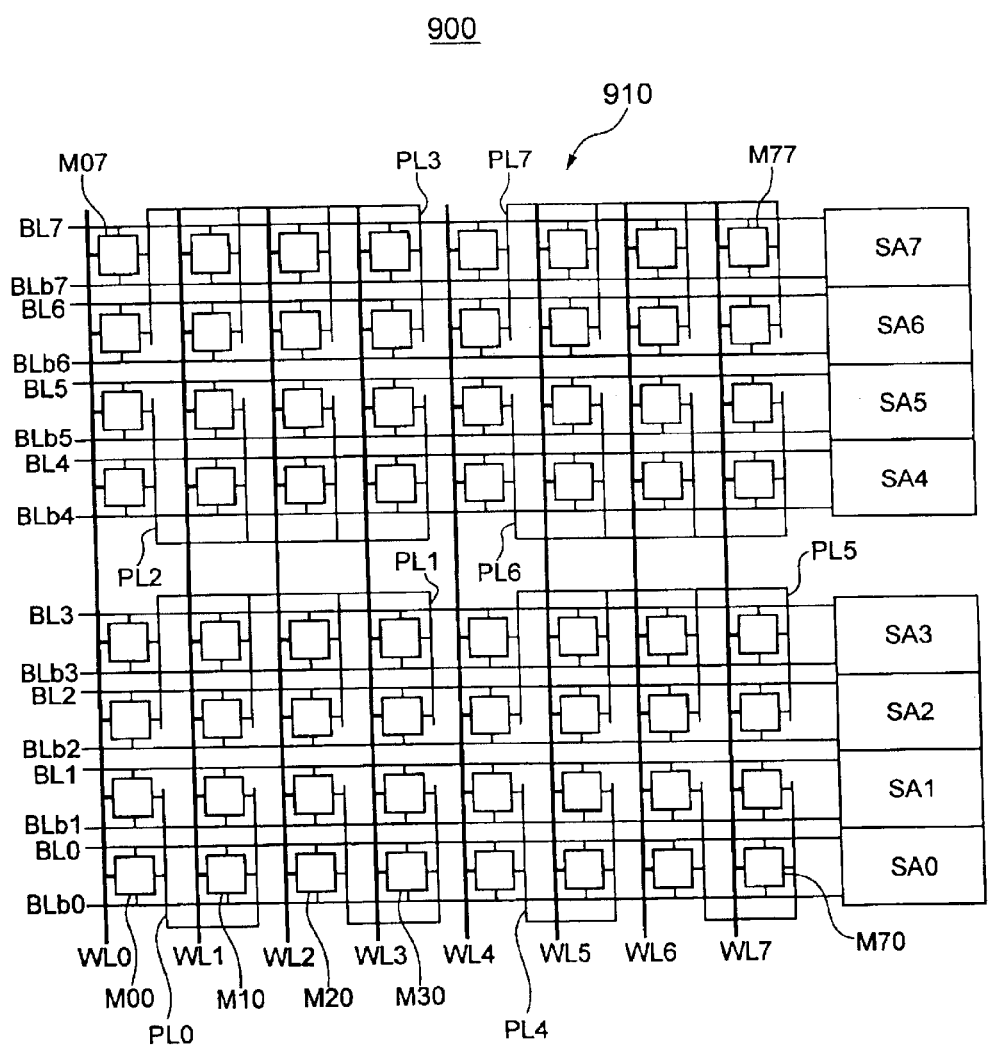
FIG. 9 is a block diagram schematically showing a configuration of a primary portion of a ferroelectric memory according to the fourth embodiment of the present invention.

FIG. 9 is a block diagram schematically showing a configuration of a primary portion of a memory cell array provided in a ferroelectric memory according to the embodiment.

As shown in FIG. 9, the memory cell array 900 differs from the aforementioned third embodiment with respect to the layouts of the plate lines PL0–PL7.

Each of the plate lines PL0–PL7 is provided in two rows of the ferroelectric memory cells M00–M77, so that each plate line applies an electrical potential to the ferroelectric memory cells provided in four columns within each corresponding row. Each of the plate lines PL0–PL7 is connected to each terminal of the ferroelectric capacitors FC0 and FC1 provided in the corresponding ferroelectric memory cells (reference is made to FIG. 2).

Figure 10:
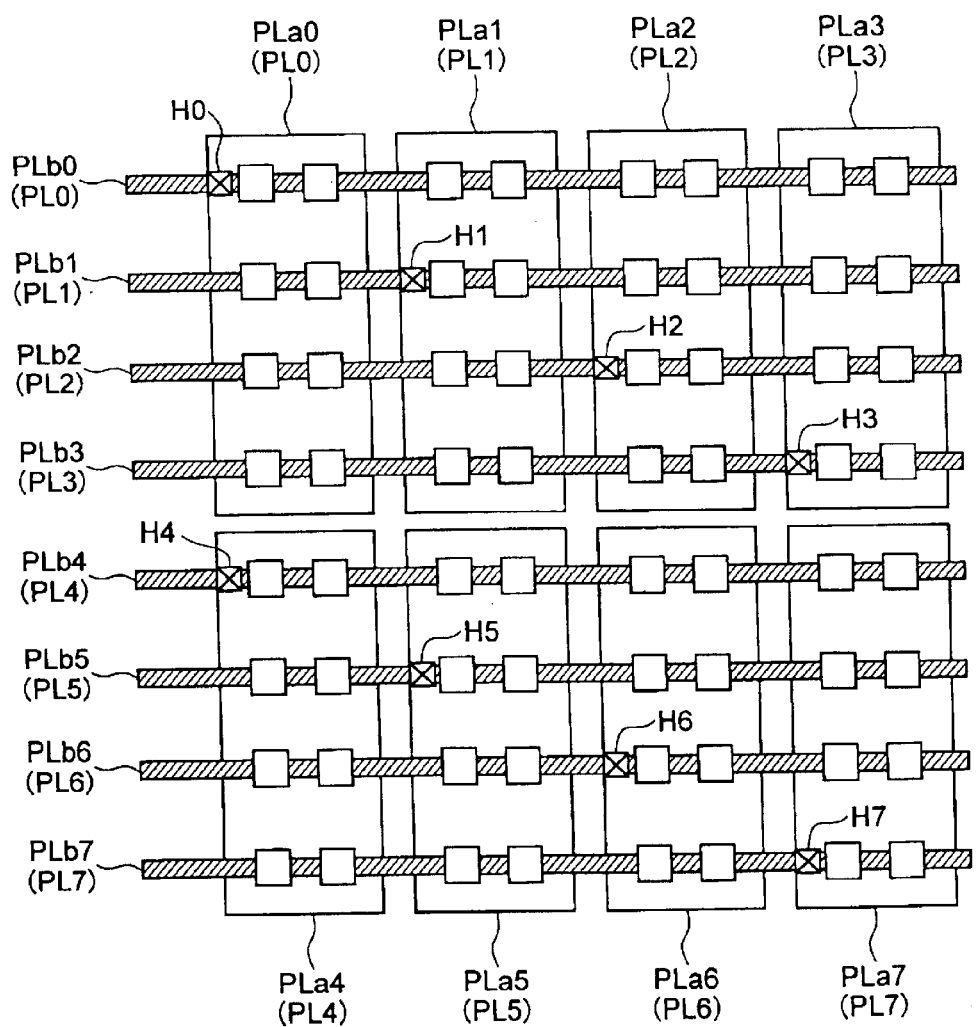
FIG. 10 is a top view conceptually showing a wiring layout of plate lines and word lines according to the fourth embodiment.

FIG. 10 is a top view conceptually showing a wiring layout of the plate lines PL0–PL7.

The plate lines PL0–PL7 include first wiring patterns PLa0–PLa7 formed in a first wiring layer in a rectangular shape and second wiring patterns PLb0–PLb7 formed in a second wiring layer in a linear shape. As shown in FIG. 10, each first wiring pattern is provided for each matrix having 2 rows×4 columns of the ferroelectric memory cells, so as to connected to the ferroelectric capacitors FC0 and FC1 provided in the corresponding ferroelectric memory cells (reference is made to FIG. 2). Each of the second wiring patterns PLb0–PLb7 is provided in each column of the ferroelectric memory cells so as to connected to the corresponding first wiring patterns PLa0–PLa7 via through-holes H1–H7.

As described above, the ferroelectric memory according to the embodiment also permits the plate lines PL0–PL7 to be made in the form of a consecutive repeated pattern.

An operation of the ferroelectric memory shown in FIGS. 9 and 10 will be hereinafter described. The following description is made based on an assumption that the memory data stored in the ferroelectric memory cells M00–M01 are simultaneously read.

Firstly, the electrical potential of the word line WL0 is set to a predetermined reading potential (high level). As a result, a predetermined electrical potential is applied to the gates of the transistors Tr0 and Tr1 each provided in the ferroelectric memory cells M00–M07 (reference is made to FIG. 2).

Then, the electrical potential of the plate line PL0 is set to a predetermined reading potential (high level). As a result, a predetermined electrical potential is applied to the terminals of the ferroelectric capacitors FC0 and FC1 each provided in the ferroelectric memory cells M00, M01, M10, M11, M20, M21, M30 and M31.

Supplying the reading potential to the word line WL0 and the plate line PL0 allows an output of minute electrical potentials from the ferroelectric memory cells M00 and M01 to the bit lines BL0, BL1, BLb0 and BLb1. The sense amplifiers SA0 and SA1 amplify the minute electrical potentials supplied from the corresponding bit lines, thereafter, the amplified potentials are output to the outside.

The ferroelectric memory cells M02–M07 are connected to the word line WL0, however, the memory cells are not connected to the plate line PL0. The data are therefore not read from the ferroelectric capacitors FC0 and FC1 in the ferroelectric memory cells M02–M07. Consequently, no deterioration of the capacitors FC0 and FC1 develops.

The ferroelectric memory cells M10, M11, M20, M21, M30 and M31 are connected to the plate line PL0, however, the memory cells are not connected to the word line WL0. The data are therefore not read from the ferroelectric capacitors FC0 and FC1 in the ferroelectric memory cells. Consequently, no deterioration of the capacitors FC0 and FC1 develops.

As described above, the amount of data which is simultaneously read is two bits in this embodiment, even though eight ferroelectric memory cells are provided in the single column. Therefore, when the two bits of data are read at a time, the number of times for accessing the ferroelectric memory cells M00–M07 will be decreased to a quarter on average as compared with the ferroelectric memory in the prior art. Furthermore, when a request is made to read data that is equal to one bit, the number of times for accessing the ferroelectric memory cells will be also decreased to a quarter on average as compared with the ferroelectric memory in the prior art.

Consequently, the ferroelectric memory according to the embodiment is expected to have a life time four times as long as that in the prior art.

In addition, the ferroelectric memory according to the embodiment decreases unnecessary access to the ferroelectric memory cells, thereby power consumption can be reduced.

Furthermore, using the layout shown in FIG. 10 allows downsizing of a semiconductor integrated circuit and simplification of the design.

Fifth Embodiment

An embodiment of the present invention will be hereinafter described with reference to FIGS. 11–14.

Figure 11:
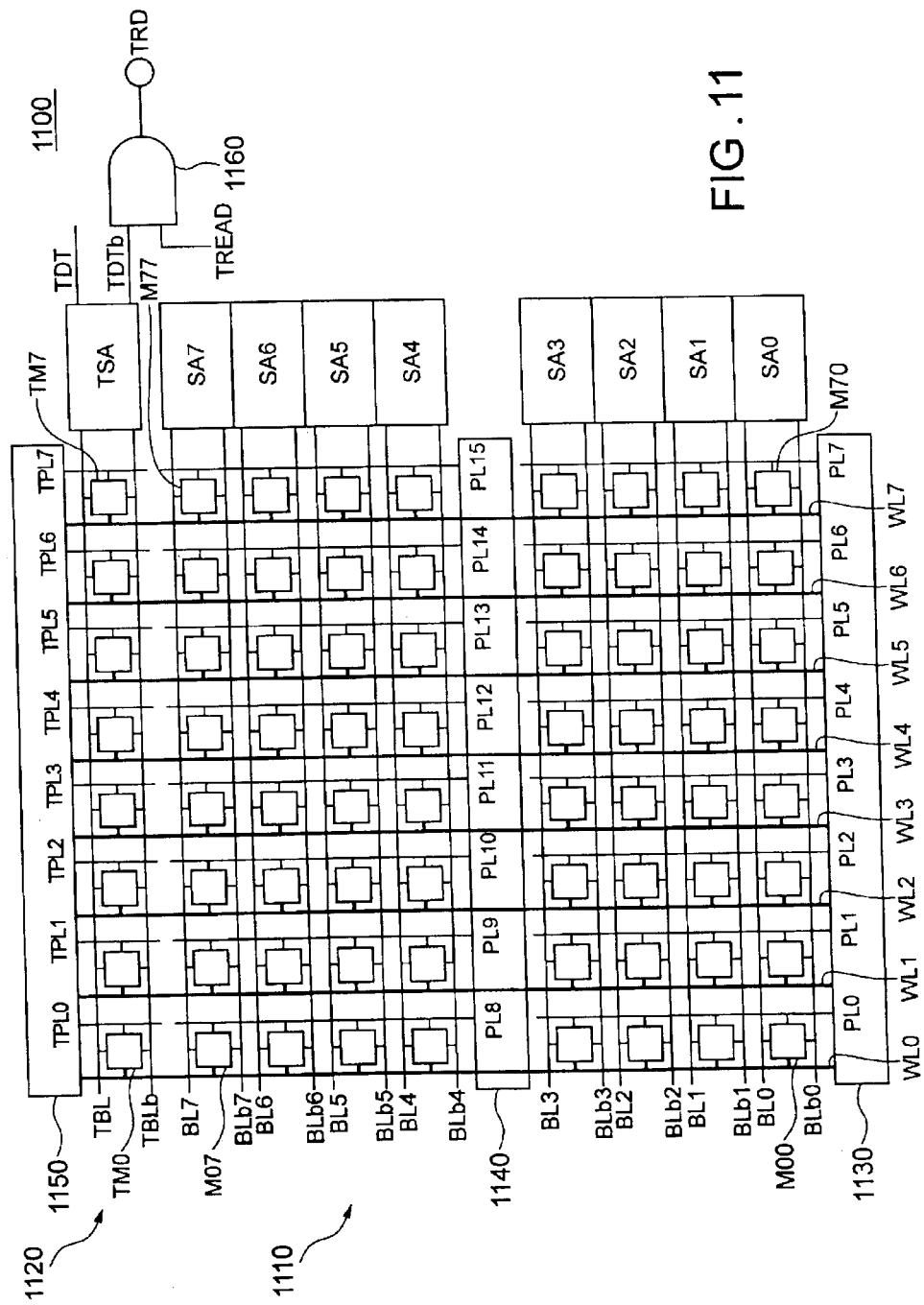
FIG. 11 is a block diagram schematically showing a configuration of a primary portion of a ferroelectric memory according to the fifth embodiment of the present invention.

FIG. 11 is a block diagram schematically showing a configuration of a primary portion of a memory cell array provided in a ferroelectric memory according to the embodiment.

As shown in FIG. 11, the memory cell array 1100 includes a storing memory cell block 1110, a determining memory cell block 1120, bit lines BL0–BL7 and BLb0–BLb7, determining bit lines TBL and TBLb, plate lines PL0–PL15, determining plate lines TPL0–TPL7, word lines WL0–WL7, sense amplifiers SA0–SA7, a determining sense amplifier TSA, plate line driving circuits 1130 and 1140, a determining plate line driving circuit 1150 and a deterioration determining circuit 1160.

The storing memory cell block 1110 includes the ferroelectric memory cells M00–M77 arranged in the form of 8 rows×8 columns. An internal structure of each of the ferroelectric memory cells M00–M77 is similar to that described in the aforementioned first through fourth embodiments (reference is made to FIG. 2).

The determining memory cell block 1120 includes ferroelectric memory cells TM0–TM7 arranged in the form of 1 row×8 columns. An internal structure of each of the ferroelectric memory cells is similar to that of the ferroelectric memory cells M00–M77. As described below, the same values are stored in the determining memory cells TM0–TM7.

The bit lines BL0–BL7 and BLb0–BLb7 are respectively provided in rows of the ferroelectric memory cells M00–M77 similar to the first through the fourth embodiments. Each of the bit lines BL0–BL7 is commonly connected to the drains of the transistors Tr0 provided along a corresponding row. Whereas, each of the bit lines BLb0–BLb7 is commonly connected to the drains of the transistors Tr1 provided along a corresponding row (reference is made to FIG. 2).

The determining bit lines TBL and TBLb are connected to the determining memory cells TM0–TM7. The determining bit line TBL is commonly connected to the drains of the transistors Tr0 provided in the determining memory cells TM0–TM7. The determining bit line TBLb is commonly connected to the drains of the transistors Tr1 provided in the memory cells TM0–TM7 (reference is made to FIG. 2).

The plate lines PL0–PL7 are respectively provided in columns of the ferroelectric memory cells M00–M73 corresponding to first through fourth rows. The plate lines PL8–PL15 are respectively provided in columns of the ferroelectric memory cells M04–M77 corresponding to fifth through eighth rows. Each of the plate lines PL0–PL15 is commonly connected to the ferroelectric capacitors FC0 and FC1 provided along a corresponding column.

The determining plate lines TPL0–TPL7 are connected to the determining ferroelectric memory cells TM0–TM7.

The word lines WL0–WL7 are provided in a column direction of the ferroelectric memory cells M00–M77 and the determining ferroelectric memory cells TM0–TM7. An electrical potential is supplied from each of the word lines WL0–WL7 to all ferroelectric memory cells in a corresponding column. Each of the word lines WL0–WL7 is connected to the gates of the transistors Tr0 and Tr1 provided in a corresponding ferroelectric memory cell.

The sense amplifiers SA0–SA7 amplify electrical potentials supplied from the corresponding bit lines, thereafter, the amplified potentials are output to the outside.

The determining sense amplifier TSA amplifies an electrical potential from the determining bit lines TBL and TBLb. The amplified potential from the determining bit lines TBL is output as a signal TDT, whereas the amplified potential from the determining bit lines TBLb is output as a signal TDTb.

An electrical potential (high level or low level) is supplied to the plate lines PL0–PL7 by the plate line driving circuit 1130. In a similar manner, an electrical potential (high level or low level) is supplied to the plate lines PL8–PL15 by the plate line driving circuit 1140.

An electrical potential (high level or low level) is supplied to the determining plate lines TPL0–TPL7 by the determining plate line driving circuit 1150.

The deterioration determining circuit 1160 compares one of the signals TDT and TDTb (the signal TDTb is shown in FIG. 11 as an example) with the determining signal TREAD. A result of this determination is output to the outside as a signal TRD.

Figure 12:
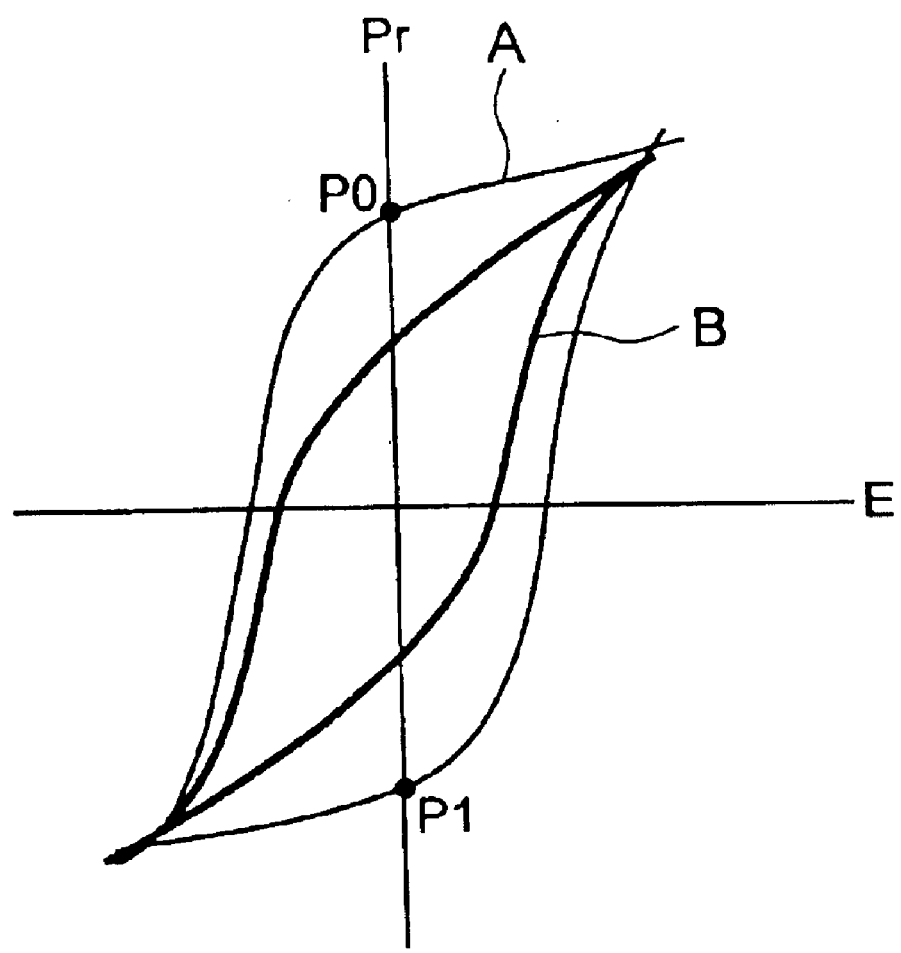
FIG. 12 is a graph showing a hysteresis characteristic of a ferroelectric capacitor.

FIG. 12 is a graph showing a hysteresis characteristic of the ferroelectric capacitor. In FIG. 12, the ordinate represents a polarization Pr in C (Coulomb) and the abscissa represents a voltage E across the terminals in V (Volt). In FIG. 12, a curve A denotes an example of a hysteresis characteristic of a ferroelectric capacitor at the initial state, whereas a curve B denotes an example of a hysteresis characteristic of a ferroelectric capacitor after deterioration. As can be understood in FIG. 12, the polarization will be either P0 or P1 when zero volts is applied as the voltage E across the terminals. As the deterioration of the ferroelectric capacitor develops, absolute values of P0 and P1 approach zero.

As described above, deterioration of the ferroelectric capacitor develops depending on the number of accessing times to the ferroelectric capacitor. Therefore when a certain ferroelectric cell has been accessed too many times, deterioration will rapidly develop in such ferroelectric memory cell. Moreover, the degree of deterioration of the ferroelectric capacitor varies device to device. Therefore, there may be a case that only a part of the ferroelectric capacitors within the memory cell array has a short life time. When the deterioration of the ferroelectric capacitor has completely developed, the memory data is destroyed. When the data is destroyed during use of the ferroelectric memory, it is difficult for the controller which controls the ferroelectric memory to restore the destroyed data. In order to solve the problem, this embodiment uses the configuration shown in FIG. 11, wherein the development of the deterioration of the ferroelectric capacitor is determined before the data is destroyed.

An operation of the ferroelectric memory shown in FIG. 11 will be hereinafter described with reference to FIGS. 13 and 14.

As described above, the same values are stored in the determining memory cells TM0–TM7. The following description is made based on an assumption that, in all of the determining memory cells TM0–TM7, the ferroelectric capacitor FC0 stores a certain value such as "0" and the ferroelectric capacitor FC1 stores a certain value such as "1".

When reading, the electrical potential of the word line WL0 is firstly set to a predetermined reading potential (high level). As a result, a high level potential is applied to each of the ferroelectric memory cells M00–M07 and the determining ferroelectric memory cell TM0 (reference is made to (A)–(C) of FIG. 13).

Then, an electrical potential is applied to the plate line PL0 by the plate line driving circuit 1130 at the high level potential. As a result, the high level potential is applied to the terminals of the ferroelectric capacitors FC0 and FC1 each provided in the ferroelectric memory cells M00–M03. Furthermore, the minute electrical potentials are output to the bit lines BL0–BL3 and BLb0–BLb3 (reference is made to (A) of FIG. 13). Whereas, the data are not read from the ferroelectric memory cells M04–M07, since a low level electrical potential is applied to the plate line PL8 (reference is made to (B) of FIG. 13).

At the same time, an electrical potential is applied to the determining plate line TPL0 by the determining plate line driving circuit 1150 at a high level potential. As a result, a high level potential is applied to the terminals of the ferroelectric capacitors FC0 and FC1 provided in the determining ferroelectric memory cell TM0. Furthermore, the minute electrical potentials are output to the determining bit lines TBL and TBLb (reference is made to (C) of FIG. 13).

The sense amplifiers SA0–SA3 amplify the minute electrical potentials supplied from the corresponding bit lines. Thereafter, the amplified potentials are output to the outside. The determining sense amplifiers TSA amplifies the values supplied from the determining bit lines TBL and TBLb. Thereafter, the amplified values are output (reference is made to (D) of FIG. 13).

Figure 13:
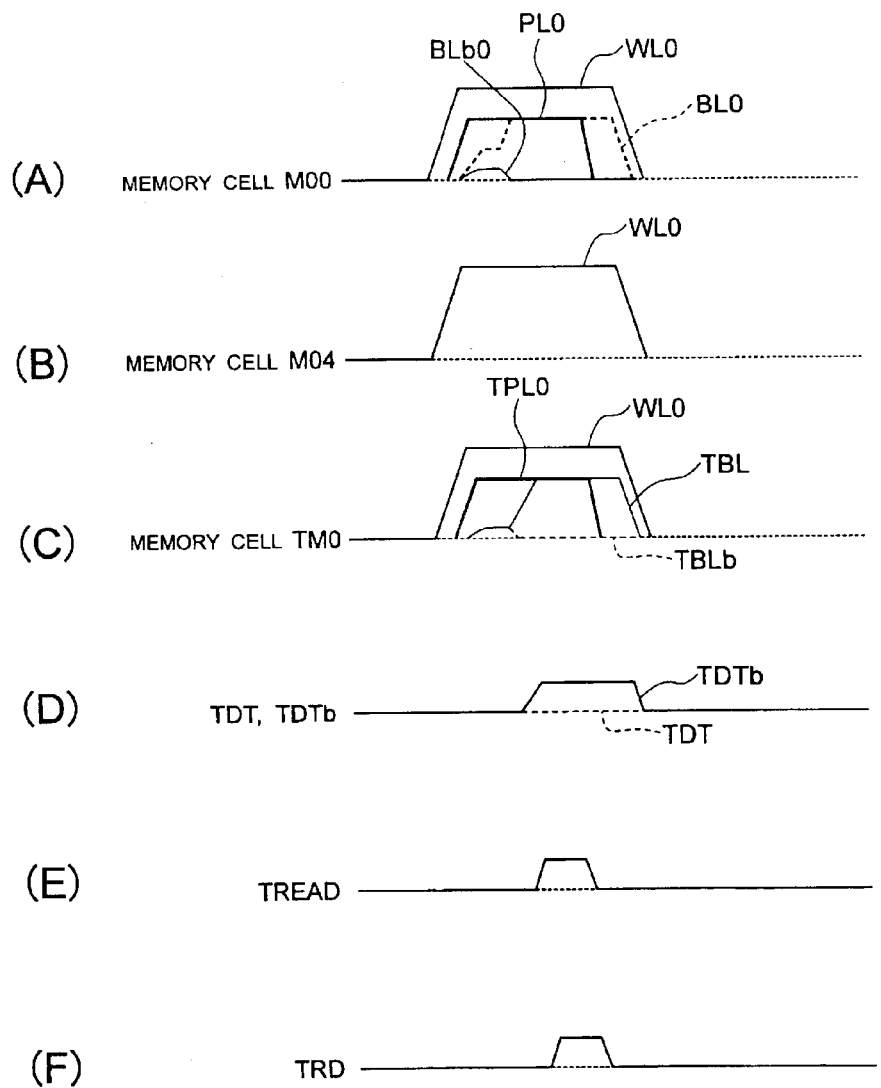
FIG. 13 is a timing chart illustrating an operation of a ferroelectric memory according to the fifth embodiment.

The deterioration determining circuit 1160 compares a signal TDTb with a determining signal TREAD (reference is made to (E) of FIG. 13). The determining signal TREAD is supplied by an external controller (not shown). As described above, since the determining ferroelectric capacitor FC1 always stores the value of "1", the signal TDTb should have a value of "1" when no deterioration has developed in the determining ferroelectric capacitors FC1. The deterioration determining circuit 1160 determines the correctness of the memory data by comparing the signal TDTb with the determining signal TREAD. When the memory data is in error, it is determined that the deterioration has already developed in the ferroelectric capacitor of the determining ferroelectric memory cell TM0. The determination result is output as a signal TRD (reference is made to (F) of FIG. 13).

Figure 14:
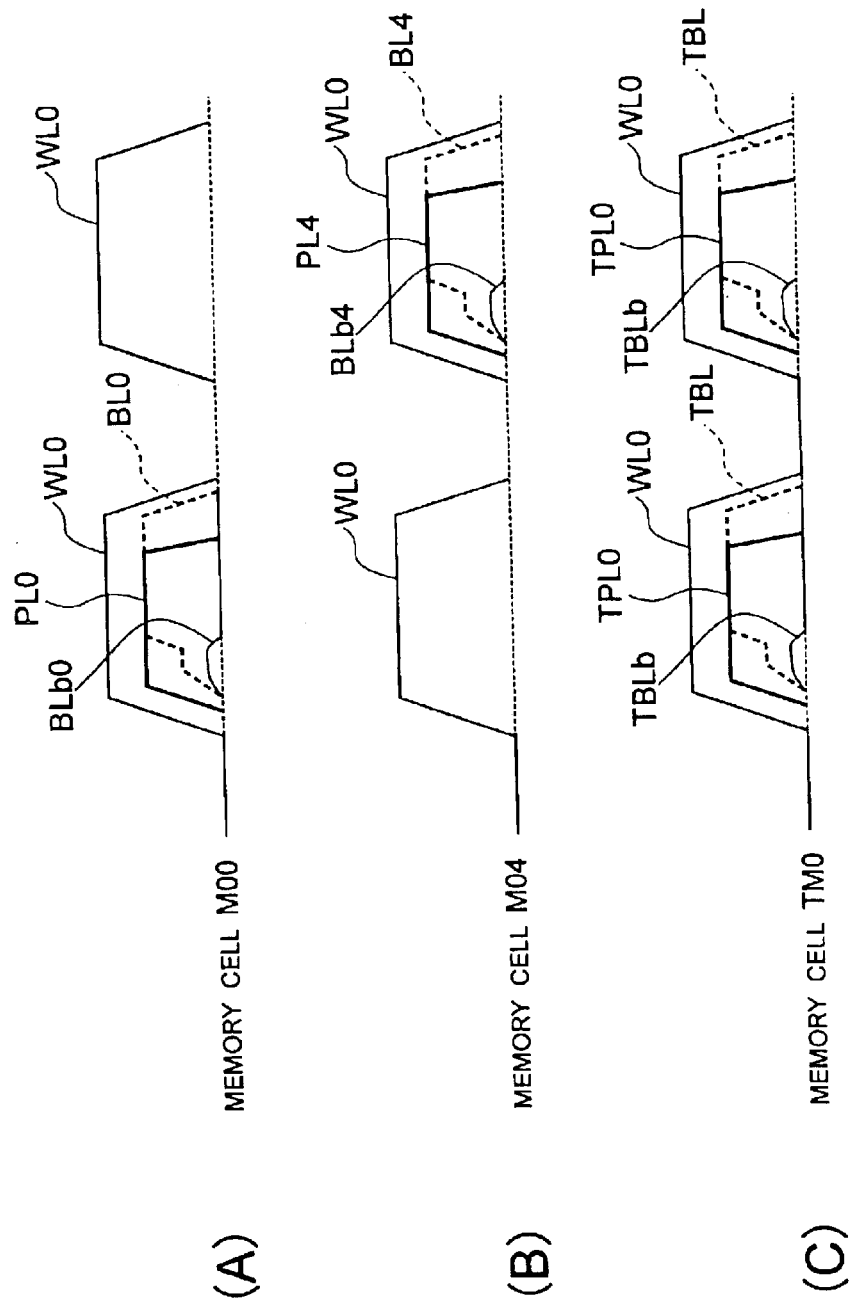
FIG. 14 is a timing chart illustrating an operation of a ferroelectric memory according to the fifth embodiment.

It should be noted that the determining plate line driving circuit 1150 applies the high level potential to the determining plate line TPL0 in either case of the high level potential being applied to the plate line PL0 or the high level potential being applied to the plate line PL8 (reference is made to (A)–(C) of FIG. 14). In a similar manner, each of the other determining plate lines TPL1–TPL7 applies the high level potential when the high level potential is applied to either of the corresponding plate lines (reference is made to (B) and (C) of FIG. 14). The number of times for accessing the determining ferroelectric memory cells TM0–TM7 will therefore be doubled on average as compared with the storing ferroelectric memory cells M00–M77. As a result, it is expected to determine the development of the deterioration in the determining ferroelectric memory cells TM0–TM7 before the storing ferroelectric memory cells M00–M77 has completely deteriorated. For the above reason, a high percentage of the memory data destruction can be prevented in accordance with the embodiment.

As described above, the amount of the data which are simultaneously read is four bits, even though the eight ferroelectric memory cells are provided in the same column. Therefore, the ferroelectric memory according to the embodiment is expected to have a life time twice as long as that in the prior art. In addition, power consumption can be reduced.

It should be noted that more than one determining ferroelectric memory cells can be provided per one word line, even though the embodiment is described based on one memory cell per one word line. In this case, reliability of the determination can be further improved by storing "1" to one of the determining ferroelectric memory cells and storing "0" to the other of the determining ferroelectric memory cells.

Sixth Embodiment

Another embodiment of the present invention will be hereinafter described with reference to FIGS. 15–16.

Figure 15:
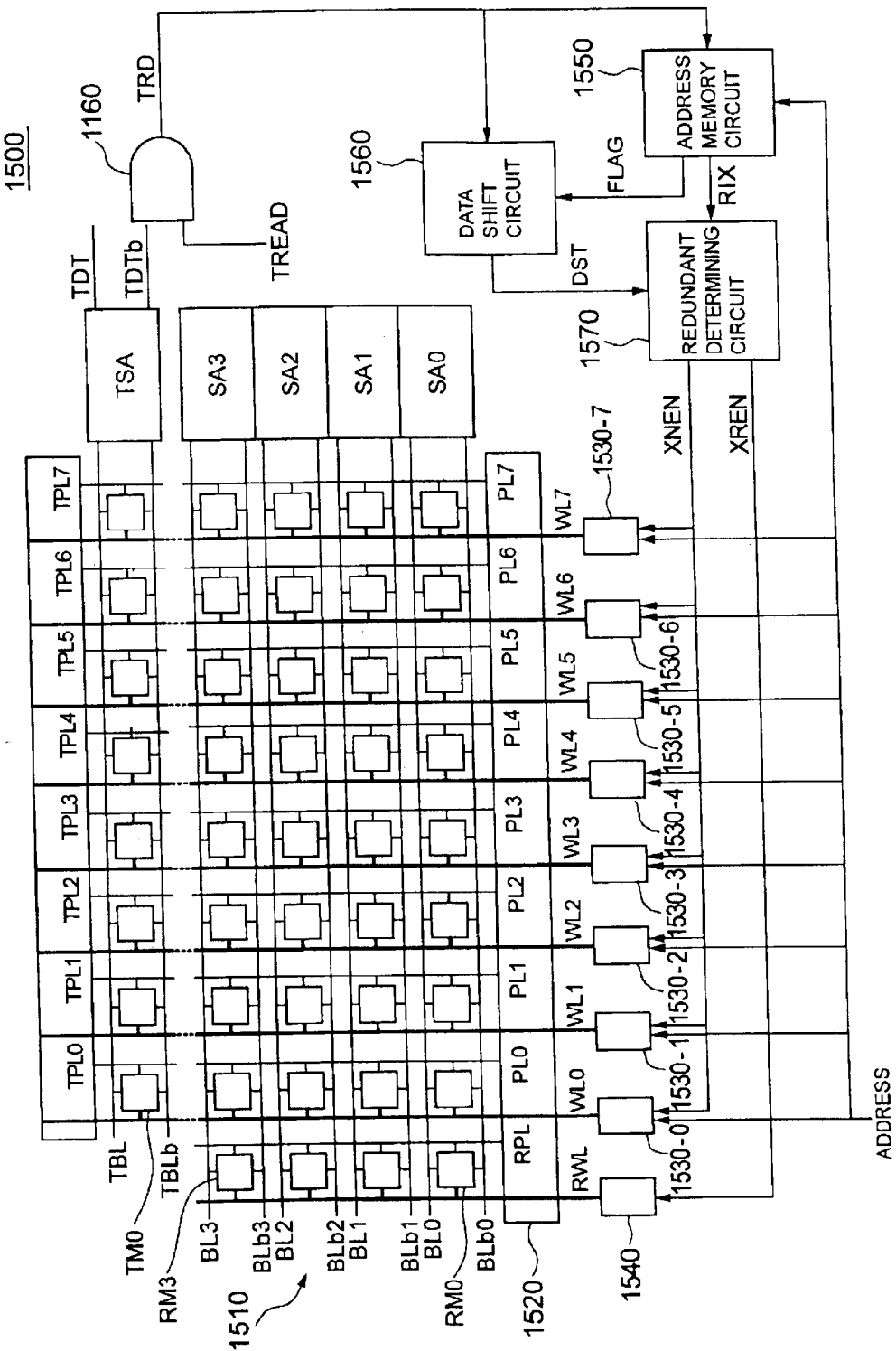
FIG. 15 is a block diagram schematically showing a configuration of a primary portion of a ferroelectric memory according to the sixth embodiment of the present invention.

FIG. 15 is a block diagram schematically showing a configuration of a primary portion of a memory call array provided in a ferroelectric memory according to the embodiment. In FIG. 15, each component with the same reference numeral as that in FIG. 11 denotes the same component as that in FIG. 11. It should be noted that the ferroelectric memory cells M04–M07 provided in the fifth row through the eighth row and the peripheral circuits corresponding thereto such as the sense amplifiers SA4–SA are omitted in FIG. 15.

The ferroelectric memory according to the embodiment includes a redundant memory cell block 1510, a redundant plate line RPL, a redundant word line RWL, a plate-line driving circuit 1520, word-line driving circuits 1530-0 through 1530-7, a redundant word-line driving circuit 1540, an address memory circuit 1550, a data shift circuit 1560 and a redundant determining circuit 1570.

The redundant memory cell block 1510 includes ferroelectric memory cells RM0–RM7 arranged in the form of 4 rows×1 column (RM4–RM7 are not shown). An internal structure of each of the ferroelectric memory cells is similar to that of the ferroelectric memory cells M00–M77. As described below, recording data is transferred to each of the redundant ferroelectric memory cells RM0–RM7 from a recording ferroelectric memory cell in a column which is determined to be deteriorated.

An electrical potential is supplied from the redundant plate line RPL to the redundant ferroelectric memory cells RM0–RM7. The redundant plate line RPL is connected to each terminal of the ferroelectric capacitors FC0 and FC1 provided in the redundant ferroelectric memory cells RM0–RM7.

An electrical potential is supplied from the redundant word line RWL to the redundant ferroelectric memory cells RM0–RM7. The redundant word line RWL is connected to each gate of the transistors Tr0 and Tr1 provided in the redundant ferroelectric memory cells RM0–RM7.

The plate-line driving circuit 1520 supplies the plate lines PL0–PL7 and the redundant plate line RPL with either one of high-level and low-level potentials.

The word-line driving circuits 1530-0 through 1530-7 supplies the word lines WL0–WL7 with either one of high-level and low-level potentials.

The redundant word-line driving circuit 1540 supplies the redundant word line RWL with either one of high-level and low-level potentials.

The address memory circuit 1550 stores an address of the storing ferroelectric memory cell in which deterioration has developed. A device such as a nonvolatile memory can be used for the address memory circuit 1550.

The data shift circuit 1560 outputs a data shift signal DST when the deterioration determining signal TRD indicates "deterioration".

The redundant determining circuit 1570 controls the plate-line driving circuit 1520, the word-line driving circuits 1530-0 through 1530-7 and the redundant word-line driving circuit 1540. The control operation by the redundant determining circuit 1570 allows the writing of the data to the redundant ferroelectric memory cells RM0–RM7 when the deterioration determining signal TRD indicates "deterioration".

An operation of the ferroelectric memory shown in FIG. 15 will be hereinafter described with reference to FIG. 16.

In a manner similar to that of the aforementioned fifth embodiment, the same values are stored in the determining memory cells TM0–TM7. The following description is made based on an assumption that, in all of the determining memory cells TM0–TM7, the ferroelectric capacitor FC0 stores a certain value such as "0" and the ferroelectric capacitor FC1 stores a certain value such as "1".

Figure 16:
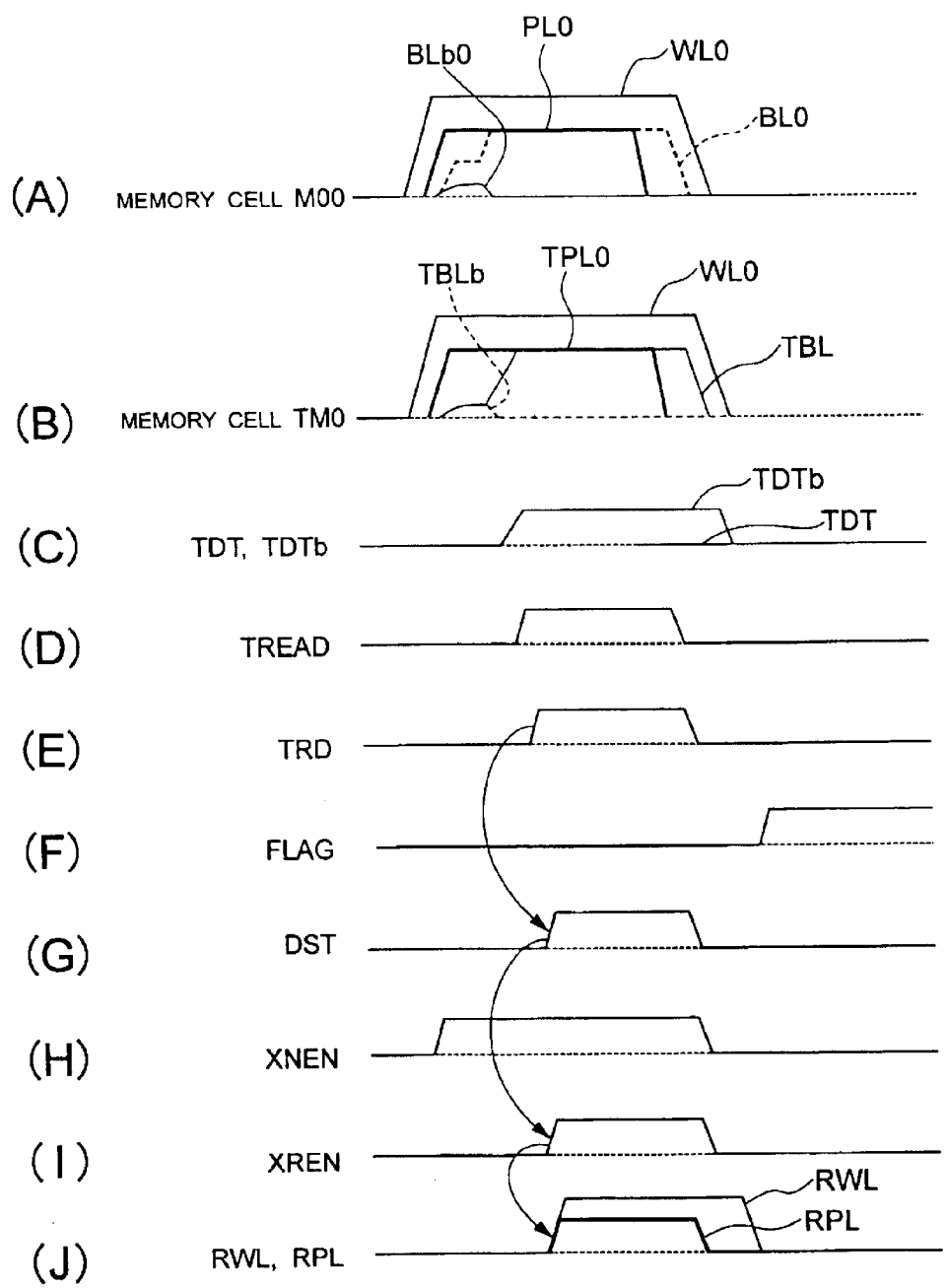
FIG. 16 is a timing chart illustrating an operation of a ferroelectric memory according to the fifth embodiment.

The redundant determining circuit 1570 sets a selection signal XNEN at a high level potential (reference is made to (H) of FIG. 16), and an address signal designating the first row is input from an external device. Thereafter, the word-line driving circuit 1530-0 sets the word line WL0 at a high level potential. As a result, a high level potential is applied to the ferroelectric memory cells M00–M03 and the determining ferroelectric memory cell TM0 (reference is made to (A) and (B) of FIG. 16). Then, setting the plate line PL0 at a high level potential allows the output of minute electrical potentials from the ferroelectric memory cells M00–M03 to the bit lines BL0–BL3 and BLb0–BLb3 (reference is made to (A) of FIG. 16). Simultaneously, setting the determining plate line TPL0 at a high level potential allows the output of minute electrical potentials from the determining ferroelectric memory cell TM0 to the determining bit lines TBL and TBLb (reference is made to (B) of FIG. 16). The determining sense amplifier TSA amplifies the values supplied from the determining bit lines TBL and TBLb to output the amplified potentials as signals TDT and TDTb (reference is made to (C) of FIG. 16). The deterioration determining circuit 1160 compares the signal TDTb with the determining signal TREAD (reference is made to (D) of FIG. 16) in order to determine whether the determining ferroelectric memory cell TM0 has already deteriorated or not. A result of the determination is output to the address memory circuit 1550 and the data shift circuit 1560 as a signal TRD (reference is made to (E) of FIG. 16).

The address memory circuit 1550 stores an address input from an external device when the deterioration determining signal TRD indicates "deterioration". Thereafter, such address is sent to the redundant determining circuit 1570 as a signal RIX. Furthermore, the data shift circuit 1560 sets the data shift circuit 1560 at a high level potential when the deterioration determining signal TRD indicates "deterioration" and the signal FLAG is at low level (reference is made to (G) of FIG. 16).

When the signal DST is high-level, the redundant determining circuit 1570 compares an address signal input from outside with a signal RIX. When the signals are coincident with each other, then the redundant determining circuit 1570 sets a selection signal XREN at a high level potential (reference is made to (I) of FIG. 16).

When the selection signal XREN is high-level, the plate-line driving circuit 1520 sets the redundant plate line RPL at a high level potential (reference is made to (J) of FIG. 16). Whereas, when the selection signal XREN is high-level, the redundant word-line driving circuit 1540 applies a high level potential to the redundant word line RWL (reference is made to (J) of FIG. 16).

The sense amplifiers SA0–SA3 amplify the minute electrical potentials for the bit lines BL0–BL3 and BLb0–BLb3. The amplified potentials are output to the outside, and the amplified potentials are re-applied to the bit lines BL0–BL3 and BLb0–BLb3. It should be noted that the redundant word line RWL is at a high level potential, therefore, the transistors Tr0 and Tr1 of the redundant ferroelectric memory cells RM0–RM3 are turned on. As a result, when an electrical potential of the redundant plate line RPL is shifted to a low level potential (reference is made to (J) of FIG. 16), a large electrical potential difference is generated across the ferroelectric capacitors in the redundant ferroelectric memory cells RM0–RM3. Consequently, the reading data amplified by the sense amplifiers SA0–SA3 is written to the redundant ferroelectric memory cells RM0–RM3.

As described above, the ferroelectric memory according to the embodiment allows the writing of the data read from storing ferroelectric memory cell to the redundant ferroelectric memory cells RM0–RM3 when the deterioration determining circuit 1160 determines that the storing ferroelectric memory cell has deteriorated. Consequently, according to the present invention, the loss of the data due to deterioration of the ferroelectric memory cell can be prevented, and reliability of the memory can be improved.

It should be noted that more than one column can be provided for the redundant ferroelectric memory cells, even though the embodiment is described based on one column configuration.

It should be also noted that the aforementioned first through sixth embodiments are described based on the configuration using the 2T2C type memory cell. It will be obvious that the present invention can be applied for the 1T1C type memory cell.

As can be understood in the aforementioned detailed description, the ferroelectric memory according to the present invention allows reduction of the number of unnecessary data access operations without expanding the peripheral circuit size, thereby extending the life time of the memory cell. Furthermore, the ferroelectric memory according to the present invention improves reliability of the memory data by detecting the life of the memory cell.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

What is claimed is:

1. A ferroelectric memory comprising:

a memory cell block including ferroelectric memory cells arranged in the form of m rows×n columns where m and n are natural numbers, each of said ferroelectric memory cells outputting a memory value from a data terminal thereof when reading potentials are applied to a first selective terminal and a second selective terminal;

a plurality of bit lines each commonly connected to the data terminals of a plurality of said ferroelectric memory cells;

a plurality of first selective lines each commonly connected to the first selective terminals of a plurality of said ferroelectric memory cells; and a plurality of second selective lines each commonly connected to the second selective terminals of a plurality of said ferroelectric memory cells, wherein said first selective lines and said second selective lines are provided so that the number of the ferroelectric memory cells connected to a same first selective line and a same second selective line is j, where j is a factor of m, wherein said first selective lines are n number of plate lines provided for the respective columns so that each plate line is connected to the first selective terminals of all of the ferroelectric memory cells in a corresponding column, and said second selective lines are n number of word lines provided over a plurality of columns so that each word line is connected to the second selective terminals of j number of the ferroelectric memory cells in the corresponding column, wherein said word lines comprise a plurality of first wiring patterns formed in a first wiring layer having a stair-like shape so as to interconnect j number of the second selective terminals provided in a plurality of consecutive columns, and a plurality of second wiring patterns formed in a second wiring layer having a reverse-stair-like shape so as to correspond to the j number of the second selective terminals provided in a plurality of adjacent columns.

2. A ferroelectric memory comprising:

a memory cell block including ferroelectric memory cells arranged in the form of m rows×n columns where m and n are natural numbers, each of said ferroelectric memory cells outputting a memory value from a data terminal thereof when reading potentials are applied to a first selective terminal and a second selective terminal;

a plurality of bit lines each commonly connected to the data terminals of a plurality of said ferroelectric memory cells;

a plurality of first selective lines each commonly connected to the first selective terminals of a plurality of said ferroelectric memory cells; and a plurality of second selective lines each commonly connected to the second selective terminals of a plurality of said ferroelectric memory cells, wherein said first selective lines and said second selective lines are provided so that the number of the ferroelectric memory cells connected to a same first selective line and a same second selective line is j, where j is a factor of m, wherein said first selective lines are n number of plate lines provided for respective columns so that each plate line is connected to the first selective terminals of all of the ferroelectric memory cells in a corresponding column, and said second selective lines are n number of word lines provided over a plurality of columns so that each word line is connected to the second selective terminals of j number of the ferroelectric memory cells in the corresponding column, wherein the second selective terminals are formed so that one-half of a distance between two columns is shifted per j number of the ferroelectric memory cells, and wherein said word lines comprise a plurality of first wiring patterns formed in a first wiring layer having a stair-like shape so as to interconnect j number of the second selective terminals provided in a plurality of consecutive columns, and a plurality of second wiring patterns formed in a second wiring layer having a linear shape so as to correspond to each column.

3. A ferroelectric memory comprising:

a memory cell block including ferroelectric memory cells arranged in the form of m rows×n columns where m and n are natural numbers, each of said ferroelectric memory cells outputting a memory value from a data terminal thereof when reading potentials are applied to a first selective terminal and a second selective terminal;

a plurality of bit lines each commonly connected to the data terminals of a plurality of said ferroelectric memory cells;

a plurality of first selective lines each commonly connected to the first selective terminals of a plurality of said ferroelectric memory cells; and a plurality of second selective lines each commonly connected to the second selective terminals of a plurality of said ferroelectric memory cells, wherein said first selective lines and said second selective lines are provided so that the number of the ferroelectric memory cells connected to a same first selective line and a same second selective line is j, where j is a factor of m, wherein said first selective lines are n number of word lines provided for respective columns so that each plate line is connected to the first selective terminals of all of the ferroelectric memory cells in the corresponding column, and said second selective lines are n number of plate lines provided over a plurality of columns so that each word line is connected to the second selective terminals of j number of the ferroelectric memory cells in the corresponding column, wherein said plate lines comprise a plurality of first wiring patterns formed in a first wiring layer having a rectangular shape so as to interconnect the second selective terminals provided in a plurality of consecutive rows and columns, and a plurality of second wiring patterns formed in a second wiring layer having a linear shape so as to correspond to each column.

4. A ferroelectric memory comprising:

a plurality of storing memory cell blocks including storing ferroelectric memory cells arranged in the form of m rows×n columns where m and n are natural numbers, each of said storing ferroelectric memory cells outputting memory value from a data terminal when reading potentials are applied to a first selective terminal and a second selective terminal;

at least one determining memory cell block including determining ferroelectric memory cells arranged in the form of 1 row×n columns, each of said determining ferroelectric memory cells outputting memory value from a data terminal when reading potentials are applied to a first selective terminal and a second selective terminal;

a plurality of bit lines each provided in row of said storing memory cell blocks so that each bit line commonly connected to the data terminals of said ferroelectric memory cells in corresponding row;

determining bit lines each provided in row of said determining memory cell blocks so that each determining bit line commonly connected to the data terminals of said ferroelectric memory cells in corresponding row;

a plurality of first selective lines each commonly provided in column of said storing memory cell blocks and said determining memory cell blocks so that each first selective line is commonly connected to the first selective terminals of the corresponding ferroelectric memory cells;

second selective lines provided such that a plurality of said second selective lines correspond to a column of said storing memory cell blocks, and each second selective line is commonly connected to the second selective terminals of the corresponding ferroelectric memory;

third selective lines provided such that each of said third selective lines corresponds to a column of said determining memory cell, and each of said line is commonly connected to the second selective terminals of said ferroelectric memory in corresponding column;

a selective control circuit which applies a reading potential to a third selective line corresponding to any one of the second selective lines to which said reading potential is applied; and a determining circuit which determines a correctness of a memory value in said determining ferroelectric memory cell.

5. The ferroelectric memory according to claim 4, further comprising:

at least one redundant memory cell block including redundant ferroelectric memory cells arranged in the form of m rows×1 column, each of said redundant ferroelectric memory cells outputting memory value from a data terminal thereof when a reading potential is applied to the first selective terminal and the second selective terminal; and a redundant determining circuit which writes memory value read from said storing ferroelectric memory cells into said redundant ferroelectric memory cells when memory value is determined as false by said determining circuit.

6. A ferroelectric memory comprising:

a bit line pair comprising a first bit line and a second bit line having a voltage level opposite a voltage level of the first bit line;

a sense amplifier coupled to the bit line pair;

a first word line formed across the bit line pair;

a second word line in parallel with the first word line;

a first ferroelectric memory cell coupled between the first and second bit lines and to the first word line;

a second ferroelectric memory cell coupled between the first and second bit lines and to the second word line; and a plate line coupled to the first and second ferroelectric memory cells.

7. A ferroelectric memory comprising:

a first bit line pair comprising a first bit line and a second bit line having a voltage level opposite a voltage level of the first bit line;

a first sense amplifier coupled to the first bit line pair;

a second bit line pair comprising a third bit line and a fourth bit line having a voltage level opposite a voltage level of the third bit line;

a second sense amplifier coupled to the second bit line pair;

a first word line formed across the first and second bit line pairs;

a second word line in parallel with the first word line;

a first ferroelectric memory cell coupled between the first and second bit lines and to the first word line;

a second ferroelectric memory cell coupled between the first and second bit lines and to the second word line;

a third ferroelectric memory cell coupled between the third and fourth bit lines and to the first word line;

a fourth ferroelectric memory cell coupled between the third and fourth bit lines and to the second word line;

a first plate line coupled to the first and second ferroelectric memory cells; and a second plate line coupled to the third and fourth ferroelectric memory cells.

8. A ferroelectric memory comprising:

a memory cell block including first ferroelectric memory cells arranged in a matrix, a plurality of bit line pairs connected to data terminals of the first ferroelectric memory cells, and a plurality of word lines and a plurality of first plate lines connected to the first ferroelectric memory cells;

a determining memory cell block including second ferroelectric memory cells, determining bit lines connected to data terminals of the second ferroelectric memory cells, and a plurality of second plate lines connected to the second ferroelectric memory cells, the second ferroelectric memory cells being respectively connected to the plurality of word lines;

a determining sense amplifier, connected to the determining bit lines, that amplifies a potential on the determining bit lines; and a deterioration determiner that compares an output of said determining sense amplifier with a determining signal, to provide a deterioration signal indicative of whether deterioration has developed in the first ferroelectric memory cells of the memory cell block.

9. The ferroelectric memory of claim 8, further comprising:

a redundant memory cell block including third ferroelectric memory cells, and a redundant word line and a redundant plate line connected to the third ferroelectric memory cells, the third ferroelectric memory cells being respectively connected to the plurality of bit line pairs of the memory cell block;

an address memory circuit, coupled to said deterioration determiner, that stores an address of a first ferroelectric memory cell of said memory cell block in which deterioration has developed; and a redundant memory controller, coupled to said address memory circuit, that controls the redundant and first plate lines, the word lines and the redundant word line to write data of the first ferroelectric memory cell in which deterioration has developed into a third ferroelectric memory cell of said redundant memory cell block, responsive to the deterioration signal.

10. The ferroelectric memory of claim 8, wherein said deterioration determiner comprises an AND gate.

* * * * *